United States Patent
Li et al.

(10) Patent No.: US 10,886,950 B2
(45) Date of Patent: Jan. 5, 2021

(54) METHOD AND APPARATUS FOR GENERATING A CODE WORD

(71) Applicant: HUAWEI TECHNOLOGIES CO., LTD., Guangdong (CN)

(72) Inventors: Bin Li, Shenzhen (CN); Hui Shen, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 23 days.

(21) Appl. No.: 16/285,153

(22) Filed: Feb. 25, 2019

(65) Prior Publication Data
US 2019/0190544 A1    Jun. 20, 2019

Related U.S. Application Data

(63) Continuation of application No. 14/664,422, filed on Mar. 20, 2015, now Pat. No. 10,243,592, which is a
(Continued)

(30) Foreign Application Priority Data

Sep. 24, 2012   (CN) .......................... 2012 1 0356670

(51) Int. Cl.
    *H03M 13/00* (2006.01)
    *H04L 1/00* (2006.01)
    *H03M 13/13* (2006.01)

(52) U.S. Cl.
    CPC ........ *H03M 13/616* (2013.01); *H03M 13/13* (2013.01); *H04L 1/0009* (2013.01); *H04L 1/0057* (2013.01)

(58) Field of Classification Search
    None
    See application file for complete search history.

(56) References Cited

U.S. PATENT DOCUMENTS

| 7,702,986 B2 | 4/2010 | Bjerke et al. |
| 7,934,146 B2 | 4/2011 | Stolpman |

(Continued)

FOREIGN PATENT DOCUMENTS

| CN | 101809958 A | 8/2010 |
| CN | 102164025 A | 8/2011 |

(Continued)

OTHER PUBLICATIONS

Jun-xuan Wang et al.,"Polar code and its characters",Modern Electronic Technique vol. .35 No. 1,dated Jan. 2012, total 3 pages.
(Continued)

*Primary Examiner* — Mujtaba M Chaudry
(74) *Attorney, Agent, or Firm* — Huawei Technologies Co., Ltd.

(57) ABSTRACT

Embodiments of the present application provide a method and an apparatus for generating a code word using a Polar code encoding manner. A sequence has N bits, in which K bits are information bits. A matrix of N rows×N columns is used for encoding the sequence. Each row of the matrix has a weight that equals to total number of non-zero elements in the row, and $i^{th}$ row of the matrix corresponds to $i^{th}$ bit position of the sequence, i=1, 2, . . . , N. Each bit position of the N-bit sequence has a reliability. The K bit positions of the sequence that are occupied by the K information bits are selected according to reliabilities of the bit positions of the sequence and weights of the rows of the matrix. The code word is generated by multiplying the sequence with the matrix.

20 Claims, 14 Drawing Sheets

Related U.S. Application Data continuation of application No. PCT/CN2013/078694, filed on Jul. 2, 2013.

(56) References Cited

U.S. PATENT DOCUMENTS

| | | | |
|---|---|---|---|
| 8,370,700 | B2 | 2/2013 | Xu et al. |
| 8,386,879 | B2 | 2/2013 | Djordjevic et al. |
| 8,595,585 | B2* | 11/2013 | Djordjevic ......... H03M 13/1117 |
| | | | 714/755 |
| 8,699,625 | B2* | 4/2014 | Djordjevic ........... H04L 1/0042 |
| | | | 370/286 |
| 8,768,175 | B2* | 7/2014 | Djordjevic .......... H04B 10/548 |
| | | | 398/152 |
| 2005/0123138 | A1* | 6/2005 | Abe ...................... H04W 12/04 |
| | | | 380/255 |
| 2007/0245212 | A1 | 10/2007 | Nordman et al. |
| 2008/0159758 | A1* | 7/2008 | Shpantzer .............. H04B 10/65 |
| | | | 398/214 |
| 2009/0217139 | A1 | 8/2009 | Roh et al. |
| 2010/0088575 | A1* | 4/2010 | Sharon .............. H03M 13/6591 |
| | | | 714/763 |
| 2010/0125769 | A1* | 5/2010 | Wang .................... H04L 1/0052 |
| | | | 714/752 |
| 2011/0150275 | A1 | 6/2011 | Tong et al. |
| 2011/0307754 | A1* | 12/2011 | Sun ................... H03M 13/1148 |
| | | | 714/752 |
| 2012/0051452 | A1 | 3/2012 | Djordjevic et al. |

FOREIGN PATENT DOCUMENTS

| | | |
|---|---|---|
| KR | 20110060635 A | 6/2011 |
| KR | 20120054571 A | 5/2012 |
| RU | 2395902 C2 | 1/2006 |
| RU | 2480832 C2 | 6/2011 |
| WO | 1999067913 A1 | 12/1999 |
| WO | 2009084891 A2 | 7/2009 |

OTHER PUBLICATIONS

XP080357414 Nadine Hussami et al.,"Performance of polar codes for channel and source coding",2009 IEEE International Symposium on Information Theory,total 5 pages.

XP055270196 Bin Li et al.,"A RM-Polar Codes",dated Jul. 21, 2014,total 2 pages.

XP011559575 Marco Mondelli et al.,"From Polar to Reed-Muller Codes: A Technique to Improve the Finite-Length Performance", IEEE Transactions on Communications ( vol. 62 , Issue: 9 , Sep. 2014 ),total 8 pages.

Eran Hof et al.,"Capacity-Achieving Polar Codes for Arbitrarily Permuted Parallel Channels",IEEE Transactions on Information Theory, vol. 59, No. 3, Mar. 2013,total 12 pages.

Mine Alsan,"Channel Polarization and Polar Codes",Technical Report Information Theory Laboratory School of Computer and Communication Sciences,dated Feb. 2012,total 58 pages.

Satish Babu Korada,"Polar Codes for Channel and Source Coding",École Polytechnique Fédérale De Lausanne,dated 2009,total 181 pages.

* cited by examiner

METHOD AND APPARATUS FOR GENERATING A CODE WORD

CROSS-REFERENCE TO RELATED APPLICATION

This application is a continuation of U.S. patent application Ser. No. 14/664,422, filed on Mar. 20, 2015, which is a continuation of International Application No. PCT/CN2013/078694, filed on Jul. 2, 2013. The international application claims priority to Chinese Patent Application No. 201210356670.8, filed on Sep. 24, 2012. All of the aforementioned patent applications are hereby incorporated by reference in their entireties.

TECHNICAL FIELD

Embodiments of the present application relate to the encoding and decoding field, and more specifically, to a method and an apparatus for generating a code word by polar encoding.

BACKGROUND

Communication systems generally use channel encoding to improve reliability of data transmission, and ensure quality of the communication. A so-called "Polar code" is an encoding method that is capable of achieving Shannon capacity and that has low encoding and decoding complexity. The Polar code is a linear block coding method. It uses a generating matrix $G_N$, and the polar encoding process is represented by:

$$x_1^N = u_1^N G_N,$$

where $G_N$ is a N×N matrix, N is a code length, $N=2^n$, $n \geq 0$. $u_1^N$ is a to-be-encoded bit sequence, and $x_1^N$ is an encoded bit sequence, also called a code word.

The matrix $G_N$ can also be written as:

$$G_N = B_N F^{\otimes n},$$

where $$F = \begin{bmatrix} 1 & 0 \\ 1 & 1 \end{bmatrix},$$

and $B_N$ is a transposed matrix, for example, a bit reversal matrix.

$F^{\otimes n}$ is a Kronecker power of F, and is defined as $F^{\otimes n} = F \otimes F^{\otimes (n-1)}$.

By using a coset code, the Polar code may be expressed as (N, K, A, $u_{A^c}$), and the above Polar encoding process can be expressed as:

$$x_1^N = u_A G_N(A) \oplus u_{A^c} G_N(A^C),$$

where A is a set of information bit indexes, and $A^C$ is a set of frozen bit indexes. $G_N(A)$ is a submatrix of $G_N$ that is obtained by taking rows of $G_N$ that are corresponding to the information bit indexes in the set A, and $G_N(A^C)$ is a submatrix of $G_N$ that is obtained by taking rows of $G_N$ that are corresponding to frozen bit indexes in set $A^C$. $u_A$ is the information bit part of the to-be-encoded bit sequence, the number of the information bits is K. $u_{A^c}$ is the frozen bit part of the to-be-encoded bit sequence, and the number of the frozen bits is N−K. For simpleness, the frozen bits may be set to 0.

A successive-cancellation (SC) method may be used in Polar decoding. The SC decoding includes the following:

A Polar code expressed by a parameter of (N, K, A, $u_{A^c}$) is taken as an example.

In the SC decoding, the following conditional likelihood functions are calculated successively:

$$L_N^{(i)}(y_1^N, \hat{u}_1^{i-1}) \triangleq \frac{W_N^{(i)}(y_1^N, \hat{u}_1^{i-1} | 0)}{W_N^{(i)}(y_1^N, \hat{u}_1^{i-1} | 1)} \quad (1)$$

where $y_1^N$ is a received signal vector $(y_1, y_2, \ldots, y_N)$, and $u_1^{i-1}$ is a bit vector $(u_1, u_2, \ldots, u_{i-1})$. W is a transition probability, and L indicates a log-likelihood ratio.

If $i \subset A$, a decision is made as follows:

$$\hat{u}_i = \begin{cases} 0, & \text{If } L_N^{(i)}(y_1^N, \hat{u}_1^{i-1}) \geq 1 \\ 1, & \text{Others} \end{cases} \quad (2)$$

If $i \subset A^C$, simply make $\hat{u}_i = u_i$ \quad (3)

In the foregoing formulas (2) and (3), $\hat{u}_i$ indicates a decision value of bit $u_i$.

The complexity of the SC decoding is $O(N \times \log_2 N)$. When a code length N is very large, the SC decoding can achieve good performance, and approaches a Shannon limit. However, when the code length is short or is of a medium length, the performance of the SC decoding of the Polar code would not exceed the performance of a Turbo code or a low density parity check (LDPC) code, therefore the decoding performance needs to be improved.

In the SC decoding, the decoding is performed bit by bit. After each bit is decoded, a hard decision is performed, and a result of the hard decision is to be used by the decoding of a subsequent bit. In this way, error propagation may exist, thereby causing degradation of the decoding performance. List decoding reserves multiple candidate paths and can achieve decoding performance that approaches maximum likelihood. The SC decoding and the list decoding are combined, to result in a SC-List decoding.

A process of the SC-List decoding of the Polar code is briefly described as follows:

Path splitting: Each time, if $\hat{u}_i$ indicates information bits, a current decoding path is split into two paths; one path $\hat{u}_i=0$ and the other path $\hat{u}_i=1$. When the total number of the paths exceeds a predefined threshold L, a most unreliable path is discarded, and only L most reliable paths (called survivor paths) are kept; and probability values on all of the paths are updated. L is a positive integer, and may be called the number of the survivor paths.

No path splitting: If $\hat{u}_i$ indicates frozen bits, no decoding path is split, $\hat{u}_i=u_i$ is set, the number of paths remains unchanged, and probability values on all of the paths are updated.

The complexity of the SC-List decoding is $O(L \times N \times \log 2N)$, and is about L times of the complexity of the SC decoding.

The code word obtained according to the foregoing Polar code encoding method quite adapts to simple SC decoding, but a minimum code distance of the code word is not very large. Even if optimal maximum likelihood (ML) decoding performance is achieved by adopting an improved SC-List decoding algorithm, its performance is not ideal, and cyclic redundancy check (CRC) bits must be cascaded to increase the minimum code distance. In this way, the performance and the application complexity of the Polar code are impacted.

SUMMARY

Embodiments of the present application provide a method and an apparatus for generating a hybrid Polar code, so that performance of a Polar code can be improved.

In a first aspect, a method for generating a hybrid Polar code is provided and includes: obtaining a first matrix of N×N and a sequence that includes N bits, where N is a code length of a hybrid Polar code to be generated, N rows of the first matrix correspond to the N bits in the sequence in a one-to-one manner, and N is a positive integer; determining reliability of the N bits, and determining the weight of each row in the N rows of the first matrix; and selecting, according to the reliability of the N bits and the weight of each row in the N rows of the first matrix, K bits among the N bits as information bits, or selecting, according to the reliability of the N bits and the weight of each row in the N rows of the first matrix, K rows among the N rows of the first matrix to construct a second matrix of K×N used for encoding, so as to encode a to-be-encoded information bit sequence according to positions of the information bits or according to the second matrix to generate the hybrid Polar code, where K is the length of the to-be-encoded information bit sequence and is a positive integer not greater than N.

With reference to the first aspect, in an implementation manner of the first aspect, the selecting, according to the reliability of the N bits and the weight of each row in the N rows of the first matrix, K bits among the N bits as information bits includes: selecting the K bits among the N bits as the information bits, where reliability of the K bits is high and the weight of rows that are of the first matrix and correspond to the K bits is greater than a first threshold.

With reference to the first aspect and the foregoing implementation manner, in another implementation manner of the first aspect, the selecting the K bits among the N bits as the information bits, where reliability of the K bits is high and the weight of rows that are of the first matrix and correspond to the K bits is greater than a first threshold includes: sorting the N bits according to the reliability; and selecting, in descending order of the reliability, the K bits among the sorted N bits as the information bits, where the weight of the rows that are of the first matrix and correspond to the K bits is greater than the first threshold.

With reference to the first aspect and the foregoing implementation manner, in another implementation manner of the first aspect, the selecting the K bits among the N bits as the information bits, where reliability of the K bits is high and the weight of rows that are of the first matrix and correspond to the K bits is greater than a first threshold includes: removing a bit from the N bits to obtain remaining bits, where the weight of a row that is of the first matrix and corresponds to the bit is smaller than or equal to the first threshold; sorting the remaining bits according to reliability of the remaining bits; and selecting, in descending order of the reliability, the K bits among the sorted remaining bits as the information bits.

With reference to the first aspect and the foregoing implementation manner, in another implementation manner of the first aspect, the selecting, according to the reliability of the N bits and the weight of each row in the N rows of the first matrix, K rows among the N rows of the first matrix to construct a second matrix of K×N used for encoding includes: selecting the K rows among the N rows of the first matrix to construct the second matrix, where reliability of bits that correspond to the K rows is high and the weight of the rows is greater than a first threshold.

With reference to the first aspect and the foregoing implementation manner, in another implementation manner of the first aspect, the selecting the K rows among the N rows of the first matrix to construct the second matrix, where reliability of bits that correspond to the K rows is high and the weight of the rows is greater than a first threshold includes: sorting the N rows of the first matrix according to the reliability of the corresponding bits; and selecting, in descending order of the reliability of the corresponding bits, the K rows among the sorted N rows to construct the second matrix, where the weight of the rows is greater than the first threshold.

With reference to the first aspect and the foregoing implementation manner, in another implementation manner of the first aspect, the selecting the K rows among the N rows of the first matrix to construct the second matrix, where reliability of bits that correspond to the K rows is high and the weight of the rows is greater than a first threshold includes: removing a row to obtain remaining rows, where the weight of the row is smaller than or equal to the first threshold; sorting the remaining rows according to reliability of bits that correspond to the remaining rows; and selecting, in descending order of the reliability of the corresponding bits, the K rows among the sorted remaining rows to construct the second matrix.

With reference to the first aspect and the foregoing implementation manner, in another implementation manner of the first aspect, the determining reliability of the N bits includes: determining capacity of each bit among the N bits, where reliability of a bit with larger capacity is higher; or determining a Bhattacharyya parameter of each bit among the N bits, where reliability of a bit with a smaller Bhattacharyya parameter is higher; or determining an error probability of each bit among the N bits, where reliability of a bit with a smaller error probability is higher.

With reference to the first aspect and the foregoing implementation manner, in another implementation manner of the first aspect, the method further includes: determining the first threshold according to a minimum code distance requirement of the hybrid Polar code.

With reference to the first aspect and the foregoing implementation manner, in another implementation manner of the first aspect, the obtaining a first matrix of N×N includes: generating the first matrix according to a value of N; or reading the first matrix that is prestored and corresponds to a value of N.

With reference to the first aspect and the foregoing implementation manner, in another implementation manner of the first aspect, the obtaining a sequence that includes N bits includes: generating the sequence of 1×N; or reading the prestored sequence of 1×N.

In a second aspect, an encoding method is provided and includes: receiving a to-be-encoded information bit sequence, where the length of the information bit sequence is K and K is a positive integer; obtaining a first matrix of N×N and a sequence that includes N bits, where N is a code length of a hybrid Polar code to be generated, N rows of the first matrix correspond to the N bits in the sequence in a one-to-one manner, and N is a positive integer greater than or equal to K; determining reliability of the N bits, and determining the weight of each row in the N rows of the first matrix; selecting, according to the reliability of the N bits and the weight of each row in the N rows of the first matrix, K bits among the N bits as information bits, or selecting, according to the reliability of the N bits and the weight of each row in the N rows of the first matrix, K rows among the N rows of the first matrix to construct a second matrix of K×N used for encoding; and encoding the to-be-encoded information bit sequence according to positions of the information bits or according to the second matrix to obtain an encoded bit sequence whose code length is N.

In a third aspect, a decoding method is provided and includes: obtaining a demodulated signal whose length is N; obtaining a first matrix of N×N and a sequence that includes N bits, where N rows of the first matrix correspond to the N bits in the sequence in a one-to-one manner, and N is a positive integer; determining reliability of the N bits, and determining the weight of each row in the N rows of the first matrix; selecting, according to the reliability of the N bits and the weight of each row in the N rows of the first matrix, K bits among the N bits as information bits, or selecting, according to the reliability of the N bits and the weight of each row in the N rows of the first matrix, K rows among the N rows of the first matrix to construct a second matrix of K×N used for encoding, where K is a positive integer not greater than N; and decoding the demodulated signal according to positions of the information bits or according to the second matrix.

In a fourth aspect, an apparatus for generating a hybrid Polar code is provided and includes: an obtaining unit, configured to obtain a first matrix of N×N and a sequence that includes N bits, where N is a code length after encoding, N rows of the first matrix correspond to the N bits in the sequence in a one-to-one manner, and N is a positive integer; a determining unit, configured to determine reliability of the N bits, and determine the weight of each row in the N rows of the first matrix; and a selecting unit, configured to select, according to the reliability of the N bits and the weight of each row in the N rows of the first matrix, K bits among the N bits as information bits, or select, according to the reliability of the N bits and the weight of each row in the N rows of the first matrix, K rows among the N rows of the first matrix to construct a second matrix of K×N used for encoding, so as to encode a to-be-encoded information bit sequence according to positions of the information bits or according to the second matrix to generate the hybrid Polar code, where K is the length of the to-be-encoded information bit sequence and is a positive integer not greater than N.

With reference to the fourth aspect, in an implementation manner of the fourth aspect, the selecting unit is specifically configured to select the K bits among the N bits as the information bits, where reliability of the K bits is high and the weight of rows that are of the first matrix and correspond to the K bits is greater than a first threshold.

With reference to the fourth aspect and the foregoing implementation manner, in another implementation manner of the fourth aspect, the selecting unit is specifically configured to sort the N bits according to the reliability, and select, in descending order of the reliability, the K bits among the sorted N bits as the information bits, where the weight of the rows that are of the first matrix and correspond to the K bits is greater than the first threshold; or the selecting unit is specifically configured to remove a bit from the N bits to obtain remaining bits, where the weight of a row that is of the first matrix and corresponds to the bit is smaller than or equal to the first threshold, sort the remaining bits according to reliability of the remaining bits, and select, in descending order of the reliability, the K bits among the sorted remaining bits as the information bits.

With reference to the fourth aspect and the foregoing implementation manner, in another implementation manner of the fourth aspect, the selecting unit is specifically configured to select the K rows among the N rows of the first matrix to construct the second matrix, where reliability of bits that correspond to the K rows is high and the weight of the rows is greater than the first threshold.

With reference to the fourth aspect and the foregoing implementation manner, in another implementation manner of the fourth aspect, the selecting unit is specifically configured to sort the N rows of the first matrix according to the reliability of the corresponding bits, and select, in descending order of the reliability of the corresponding bits, the K rows among the sorted N rows to construct the second matrix, where the weight of the rows is greater than the first threshold; or the selecting unit is specifically configured to remove a row to obtain remaining rows, where the weight of the row is smaller than or equal to the first threshold, sort the remaining rows according to reliability of bits that correspond to the remaining rows, and select, in descending order of the reliability of the corresponding bits, the K rows among the sorted remaining rows to construct the second matrix.

With reference to the fourth aspect and the foregoing implementation manner, in another implementation manner of the fourth aspect, the determining unit is further configured to determine the first threshold according to a minimum code distance requirement of the hybrid Polar code.

With reference to the fourth aspect and the foregoing implementation manner, in another implementation manner of the fourth aspect, the determining unit is specifically configured to determine capacity of each bit among the N bits, where reliability of a bit with larger capacity is higher; or determine a Bhattacharyya parameter of each bit among the N bits, where reliability of a bit with a smaller Bhattacharyya parameter is higher; or determine an error probability of each bit among the N bits, where reliability of a bit with a smaller error probability is higher.

In a fifth aspect, an encoding apparatus is provided and includes: a receiving unit, configured to receive a to-be-encoded information bit sequence, where the length of the information bit sequence is K and K is a positive integer; an obtaining unit, configured to obtain a first matrix of N×N and a sequence that includes N bits, where N is a code length, N rows of the first matrix correspond to the N bits in the sequence in a one-to-one manner, and N is a positive integer; a determining unit, configured to determine reliability of the N bits, and determine the weight of each row in the N rows of the first matrix; and a selecting unit, configured to select, according to the reliability of the N bits and the weight of each row in the N rows of the first matrix, K bits among the N bits as information bits, or select, according to the reliability of the N bits and the weight of each row in the N rows of the first matrix, K rows among the N rows of the first matrix to construct a second matrix of K×N used for encoding, where K is the length of the to-be-encoded information bit sequence and is a positive integer not greater than N; and an encoding unit, configured to encode the information bit sequence according to positions of the information bits or according to the second matrix to obtain an encoded bit sequence whose code length is N.

In a sixth aspect, a transmitter is provided and includes the encoding apparatus according to the fifth aspect, and a transmitting unit, configured to transmit an encoded bit sequence generated by the encoding apparatus.

In a seventh aspect, a decoding apparatus is provided and includes: a receiving unit, configured to receive a demodulated signal whose length is N; an obtaining unit, configured to obtain a first matrix of N×N and a sequence that includes N bits, where N rows of the first matrix correspond to the N bits in the sequence in a one-to-one manner, and N is a positive integer; a determining unit, configured to determine reliability of the N bits, and determine the weight of each row in the N rows of the first matrix; a selecting unit, configured to select, according to the reliability of the N bits and the weight of each row in the N rows of the first matrix, K bits among the N bits as information bits, or select, according to the reliability of the N bits and the weight of each row in the N rows of the first matrix, K rows among the N rows of the first matrix to construct a second matrix of K×N used for encoding, where K is a positive integer not greater than N; and a decoding unit, configured to decode the demodulated signal according to positions of the information bits or according to the second matrix to obtain a decoded information bit sequence.

In an eighth aspect, a receiver is provided and includes the decoding apparatus according to the seventh aspect, and a demodulating unit, configured to demodulate a received signal to generate a demodulated signal whose length is N, and output the demodulated signal to the decoding apparatus, where N is a positive integer.

In a ninth aspect, a communications system is provided and includes the transmitter according to the sixth aspect and the receiver according to the eighth aspect.

In the embodiments of the present application, when an information bit of a hybrid Polar code is selected, not only reliability of a bit is considered, but also the weight of a row that is of a first matrix and corresponds to the bit is considered, so that performance of the Polar code can be improved.

BRIEF DESCRIPTION OF DRAWINGS

The following briefly introduces the accompanying drawings used in describing the embodiments.

DESCRIPTION OF EMBODIMENTS

The following describes the technical solutions in the embodiments of the present application with reference to the accompanying drawings.

Embodiments of the present application may be applied to various communications systems. Therefore, the following description is not limited to a specific communications system, such as a global system for mobile communications (GSM), a code division multiple access (CDMA) system, a wideband code division multiple access (WCDMA) system, a general packet radio service (GPRS) system, a long term evolution (LTE) system, an LTE frequency division duplex (FDD) system, an LTE time division duplex (TDD) system, and a universal mobile telecommunications system (UMTS). All information or data encoded using a traditional Turbo code or an LDPC code by a base station or a terminal in the foregoing systems may be encoded by using a Polar code provided in the embodiments.

The number of non-zero code elements in a code word is called hamming weight (also called code weight) of the code word.

For a binary code word, a code weight W is the number of code elements 1 in a code word. For example, for a code word 110000, its code length n=6, and its code weight W=2.

In the present application, a "weight" of each row in a matrix equals to the number of non-zero elements in this row. For a binary matrix F, the weight of each row is the number of 1s in this row.

The number of information positions where digits are different between information positions corresponding to two code groups is called a distance between the code groups and is called a code distance for short, and is also called a Hamming distance. For example, a code distance between a code group 1100 and a code group 0011 is 4. The "code distance" of a hybrid Polar code involved in present application refers to the number of information positions where digits are different between information positions corresponding to a to-be-encoded information bits and a hybrid polar code that is generated after these information bits are encoded. The code distance embodies error correction performance of encoding. A larger code distance between two code groups before and after encoding indicates better error correction performance.

Figure 1:
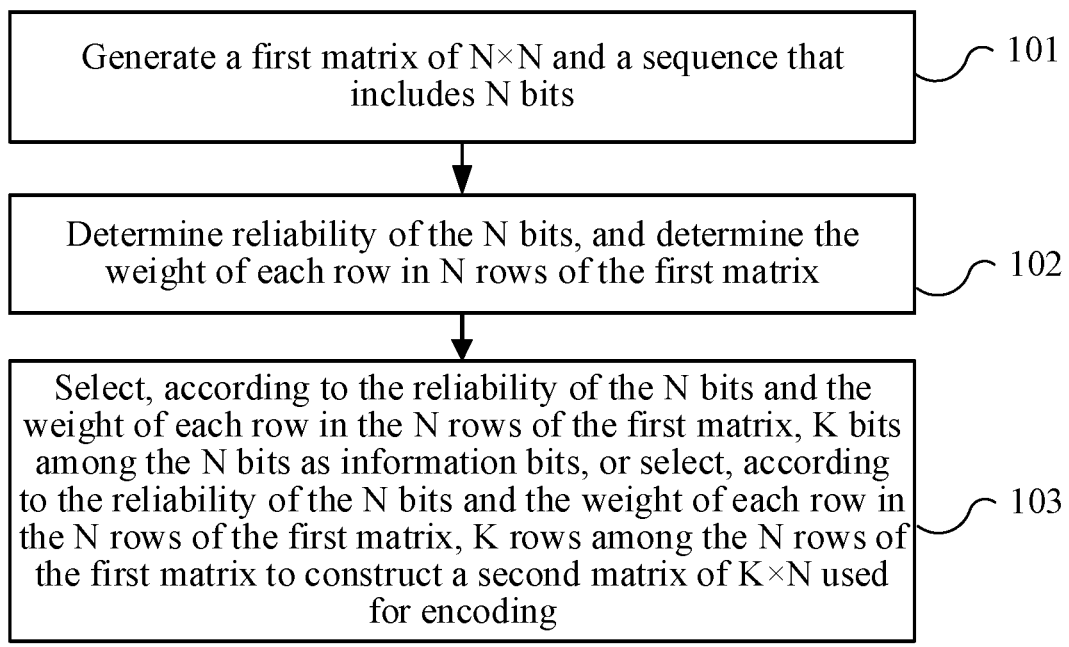
FIG. 1 is a flowchart of a method for generating a hybrid Polar code word according to an embodiment of the present application.

FIG. 1 is a flowchart of a method for generating a hybrid Polar code according to an embodiment of the present application. The method shown in FIG. 1 may be executed by an encoding device (referred to as encoding end) or a decoding device (referred as decoding end), or may be executed by a single Polar code generating apparatus.

101: Obtain a first matrix of N rows×N columns and a sequence that includes N bits, where N is a code length of a Polar code word, each row of the N rows of the first matrix corresponds to one bit of the N bits in the sequence, and N is a positive integer.

For example, N may be an integer power of 2, i.e. $N=2^n$, where n is a nonnegative integer.

Optionally, the first matrix may be generated by an existing manner according to a value of N. For example, the first matrix may be generated for a Polar code. Specifically, a Polar code is a linear block code. Its generating matrix is $G_N$, and its encoding process is $x_1^N = u_1^N G_N$, where $G_N = B_N F^{\otimes n}$.

$$F = \begin{bmatrix} 1 & 0 \\ 1 & 1 \end{bmatrix},$$

and $B_N$ is a transposed matrix, for example, a bit reversal matrix.

$F^{\otimes n}$ is a Kronecker power of F, and is defined as $F^{\otimes n} = F \otimes F^{\otimes (n-1)}$. Herein, $F^{\otimes n}$ is a matrix of N×N.

The foregoing matrix $G_N$ or a variant (for example $F^{\otimes n}$) of the $G_N$ may be used as the first matrix.

Optionally, as another embodiment, the first matrix is prestored, and it is read from a storage. In other words, matrixes corresponding to different values of N may be prestored locally.

Optionally, as another embodiment, a sequence of 1×N may be generated according to a value of N, for example, $u_1^N$ in the foregoing. The sequence is a set including information bits and frozen bits. Alternatively, the sequence of 1×N may be prestored and read from a storage. In other words, sequences $u_1^N$ corresponding to different values of N may be prestored locally.

Each of the N rows of the first matrix of N×N corresponds to one of N bits in the sequence in an one-to-one manner. Specifically, each row of the first matrix corresponds to one bit in $u_1^N$.

102: Determine a reliability for each of the N bits in the sequence, and determine a weight of each row in the first matrix.

In the embodiments of the present application, a measurement form of the reliability is not limited. For example, reference may be made to a reliability measurement of an existing Polar code such as bit capacity, a Bhattacharyya parameter, and an error probability. However, for the existing Polar code, information bits are selected based on only reliability in a generating process. Therefore, performance needs to be further improved.

Optionally, as an embodiment, in step 102, capacity of each bit among the N bits may be determined, where reliability of a bit with larger capacity is higher.

The capacity of each bit may be calculated in an existing manner. For example, a binary discrete memory-less channel W is given, and capacity I(W) is defined as follows:

$$I(W) \triangleq \sum_{y \in y} \sum_{x \in \chi} \frac{1}{2} W(y|x) \log \frac{W(y|x)}{\frac{1}{2}W(y|0) + \frac{1}{2}W(y|1)} \quad (4)$$

Optionally, as another embodiment, in step 102, a Bhattacharyya parameter of each bit among the N bits may be determined, where reliability of a bit with a smaller Bhattacharyya parameter is higher.

A binary discrete memory-less channel W is given, and Bhattacharyya parameter Z(W) is defined as follows:

$$Z(W) \triangleq \sum_{y \in y} \sqrt{W(y|0)W(y|1)} \quad (5)$$

A Bhattacharyya parameter is relevant to an upper limit of a maximum likelihood decoding frame error rate. A smaller value of a Bhattacharyya parameter indicates higher reliability of an information bit.

Optionally, as another embodiment, in step 102, an error probability of each bit among the N bits may be determined, where reliability of a bit with a smaller error probability is higher. For example, an error pattern of each bit may be obtained through Monte Carlo simulation, and the error probability of each bit may be determined with reference to the number of simulation times.

Optionally, as an embodiment, a manner for determining the weight of a row is to add elements that are not 0 in each row. Therefore, the weight of a row may indicate the total number of elements 1 in this row.

103: Select, according to the reliability of the N bits and the weight of each row in the N rows of the first matrix, K bits among the N bits as information bits, or select, according to the reliability of the N bits and the weight of each row in the N rows of the first matrix, K rows among the N rows of the first matrix to construct a second matrix of K×N used for encoding, so as to encode a to-be-encoded information bit sequence according to positions of the information bits or according to the second matrix to generate the hybrid Polar code, where K is the length of the to-be-encoded information bit sequence and is a positive integer not greater than N.

Among the N bits, the K bits are information bits, and other N−K bits are frozen bits. The information bits are bits used for encoding, and the frozen bits are generally set to 0. In the embodiment of the present application, an order of determining the information bits and the frozen bits is not limited. For example, when the K bits among the N bits are selected as information bits, K information bits may be selected first, and the remaining N−K bits are used as frozen bits; or the N−K frozen bits may be obtained first, and then the remaining K bits are used as information bits. These manners all fall within the scope of the embodiments of the present application.

After the K information bits are determined, K bits of the to-be-encoded information bit sequence are placed at positions corresponding to the K information bits, and then a bit sequence $u_1^N$ whose length is N may be obtained, so that the encoding may be performed according to $x_1^N = u_1^N G_N$.

In the same way, when the K rows of the second matrix are selected, the K rows may be selected first, and the remaining N−K rows may be removed; or the N−K rows that need to be removed may be obtained first, and then the remaining K rows may be used to construct the second matrix. These manners all fall within the scope of the embodiments of the present application.

In fact, the K rows of the second matrix may correspond to the K information bits in a one-to-one manner. Specifically, the second matrix may be $G_N(A)$ in the foregoing or a variant (for example, a matrix constructed by corresponding K rows in $F^{\otimes n}$) of $G_N(A)$. In this way, the encoding may be performed according to $x_1^N = u_A^N G_N(A)$, where $u_A$ indicates the to-be-encoded information bit sequence, and the length is K. In a case where frozen bits are set to 0 ($u_{A^c}=0$), encoding results $x_1^N = u_1^N G_N$ and $x_1^N = u_A^N G_N(A)$ are the same.

The code length N and the number K of the information bits are both values that may be preset. That is, a code rate of a hybrid Polar code obtained according to the embodiment of the present application is variable. The code rate is determined by K and N, for example, K/N.

In the embodiment of the present application, when an information bit or an encoding matrix of a hybrid Polar code is selected, not only reliability of a bit is considered, but also the weight of a row that is of a matrix and corresponds to the bit is considered, so that performance of the Polar code can be improved.

In addition, the hybrid Polar code obtained in the embodiment of the present application is also applied to SC or SC-List decoding, which can achieve better decoding performance and is an optimized Polar code.

Optionally, as an embodiment, in step 103, the K bits among the N bits are selected as the information bits, where reliability of the K bits is high and the weight of rows that are of the first matrix and correspond to the K bits is greater than a first threshold. The information bits selected in this way have a larger hamming distance, thereby improving performance of a Polar code.

In the embodiment of the present application, two factors, namely reliability and row weight, are both considered, but an order of using the two factors are not limited.

Optionally, as an embodiment, in step 103, the reliability may be used to perform selection first. Specifically, the N bits may be sorted according to the reliability; and the K bits among the sorted N bits are selected, in descending order of the reliability, as the information bits, where the weight of the rows that are of the first matrix and correspond to the K bits is greater than the first threshold.

Optionally, as an embodiment, in step 103, the row weight may be used to perform selection first. Specifically, a bit may be removed from the N bits to obtain remaining bits, where the weight of a row that corresponds to the bit is smaller than or equal to the first threshold. Then, the remaining bits are sorted according to reliability of the remaining bits, and finally the K bits among the sorted remaining bits are selected, in descending order of the reliability, as the information bits.

It should be noted that, in the foregoing embodiment, a bit corresponding to a row whose weight is equal to the first threshold is used as a frozen bit, but this is not limited in the embodiment of the present application; or a bit corresponding to a row whose weight is equal to the first threshold may be used as an information bit, and a hybrid Polar code with similar performance can also be obtained. Therefore such modification also falls within the scope of the embodiments of the present application.

Optionally, as another embodiment, before step 103, the first threshold may also be determined according to a minimum code distance requirement of the Polar code. However, in the embodiment of the present application, a manner for determining the first threshold is not limited. The first threshold may also be determined according to other factors or with reference to other factors in addition to the minimum code distance requirement.

In the embodiment of the present application, "sorting" of the bits or rows is only a logic process executed for an operation of selecting the bits or rows, but is not to change a sorting order of rows of the information bits or encoding matrixes that are finally obtained. In other words, the K information bits finally obtained are still sorted according to their original position order among the N bits; and the K rows finally obtained are also sorted according to their original position order in the first matrix to construct the second matrix.

The following describes the embodiments of the present application in further detail with reference to specific examples. It should be noted that, examples shown in FIG. 2 to FIG. 9 are only intended to help a person of skill in the art understand the embodiments of the present application, but not to limit the embodiments of the present application to a specific numerical value or a specific scenario that is exemplified. For example, an F matrix $F^{\otimes n}$ is used as an example of a first matrix in the following, but the embodiments of the present application are not limited to this, and $G_N$ may also be used as the first matrix.

In examples shown in FIG. 2 to FIG. 5, K bits are directly selected as information bits, but the embodiments of the present application are not limited to this; or N–K frozen bits may be selected first, and the remaining K bits are used as information bits. In this case, a manner of selecting the N–K frozen bits may be opposite to a manner of selecting the information bits. For example, N–K bits among N bits are selected as frozen bits, where reliability of the N–K bits is low or the weight of matrix rows that correspond to the N–K bits is smaller than or equal to a first threshold.

Figure 2:
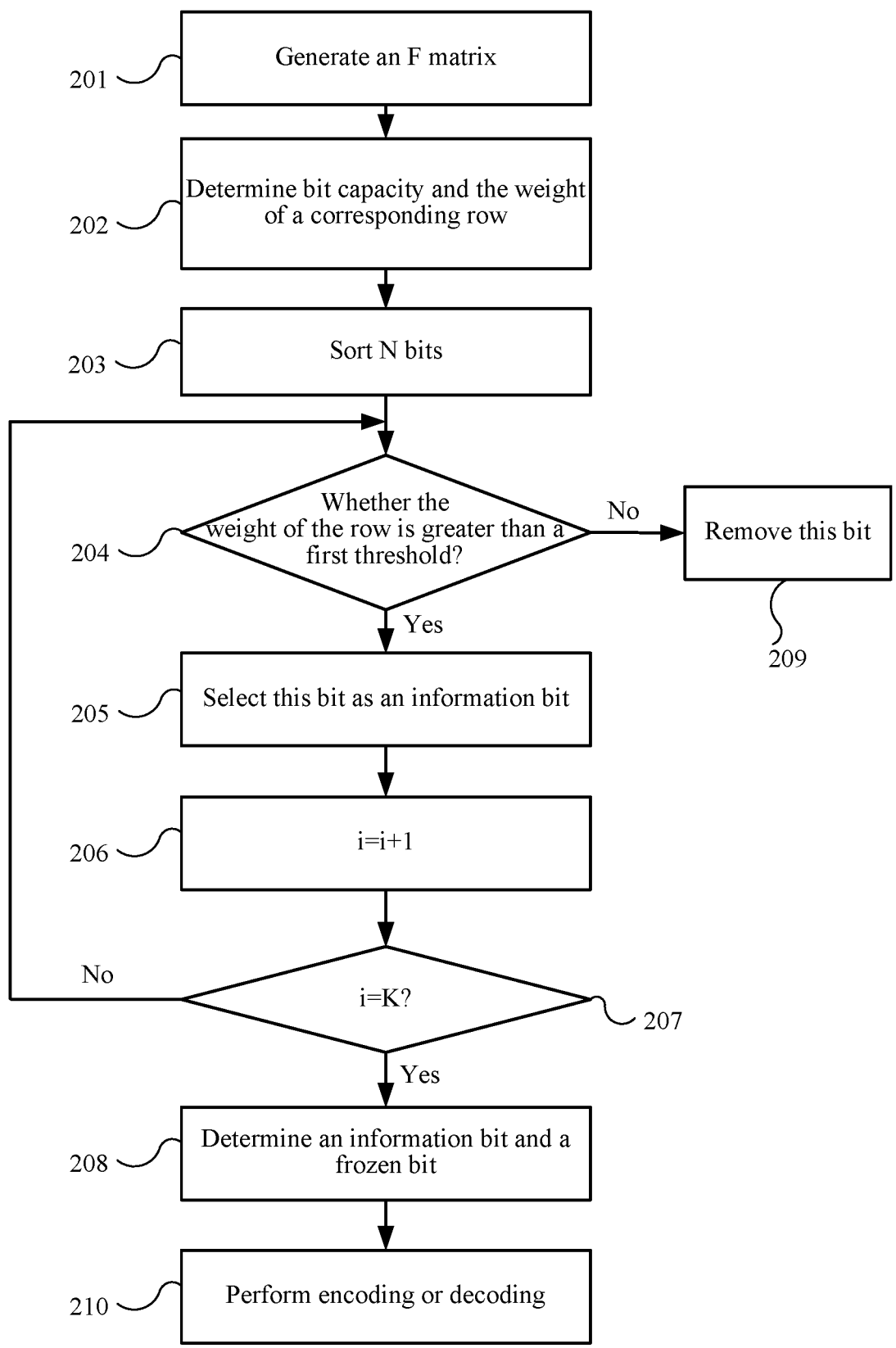
FIG. 2 is a flowchart of a process for generating a hybrid Polar code word according to another embodiment of the present application.

FIG. 2 is a schematic flowchart of a process for generating a hybrid Polar code according to another embodiment of the present application. In an embodiment shown in FIG. 2, bit capacity is used as a measurement of reliability, and when an information bit is to be selected, reliability is considered first, and N bits are sorted according to the reliability; and then, K bits among the sorted N bits are selected, in descending order of the reliability, as information bits, where the weight of rows that correspond to the K bits is greater than a first threshold.

201: Generate an F matrix of N×N.

202: Determine bit capacity of N bits, and determine the weight of rows that correspond to the N bits.

203: Sort the N bits according to values of the bit capacity. For example, the N bits may be sorted in descending order of the bit capacity.

204: Among the sorted N bits, successively determine, in the descending order of the bit capacity, whether the weight of a row that corresponds to each bit is greater than a first threshold.

205: If it is determined in step 204 that the weight of a row that corresponds to a certain bit is greater than the first threshold (a branch "Yes" of step 204), select this bit as an information bit, and record an index of this bit.

206: Increase the number i of selected information bits by 1.

207: Determine whether the number i of the information bits has reached K.

If the number of the information bits has not reached K (a branch "No" of step 207, that is, i<K), go back to step 204, and continue to determine whether the weight of a row that corresponds to a next bit is greater than the first threshold.

208: If the number of the information bits has reached K (a branch "Yes" of step 207, that is, i=K), selection of the information bits has been completed, that is, the K bits recorded in step 205 are used as the information bits. At the same time, the remaining N–K bits are used as frozen bits.

209: If it is determined in step 204 that the weight of a row that corresponds to a certain bit is smaller than or equal to the first threshold (a branch "No" of step 204), remove this bit, and do not use this bit as an information bit. In other words, this bit is recorded as a frozen bit in step 208. Generally speaking, the frozen bit may be set to 0.

210: After the K information bits and the N−K frozen bits are determined, perform hybrid Polar encoding or decoding.

According to the embodiment of the present application, a bit may be selected as an information bit, where reliability of the bit is high and the weight of a row that corresponds to the bit is greater than a first threshold, so that a minimum code distance of a Polar code can be increased, thereby improving performance of the Polar code. At the same time, the hybrid Polar code obtained in the embodiment of the present application may achieve better SC or SC-List decoding performance.

In addition, it needs to be noted that, in step 208, if the N bits have been traversed, but the number of obtained information bits still does not reach K (i<K), the first threshold may be adjusted. For example, a value of the first threshold is decreased appropriately, and the method shown in FIG. 2 is executed again, until the number of the obtained information bits can reach K.

Figure 3:
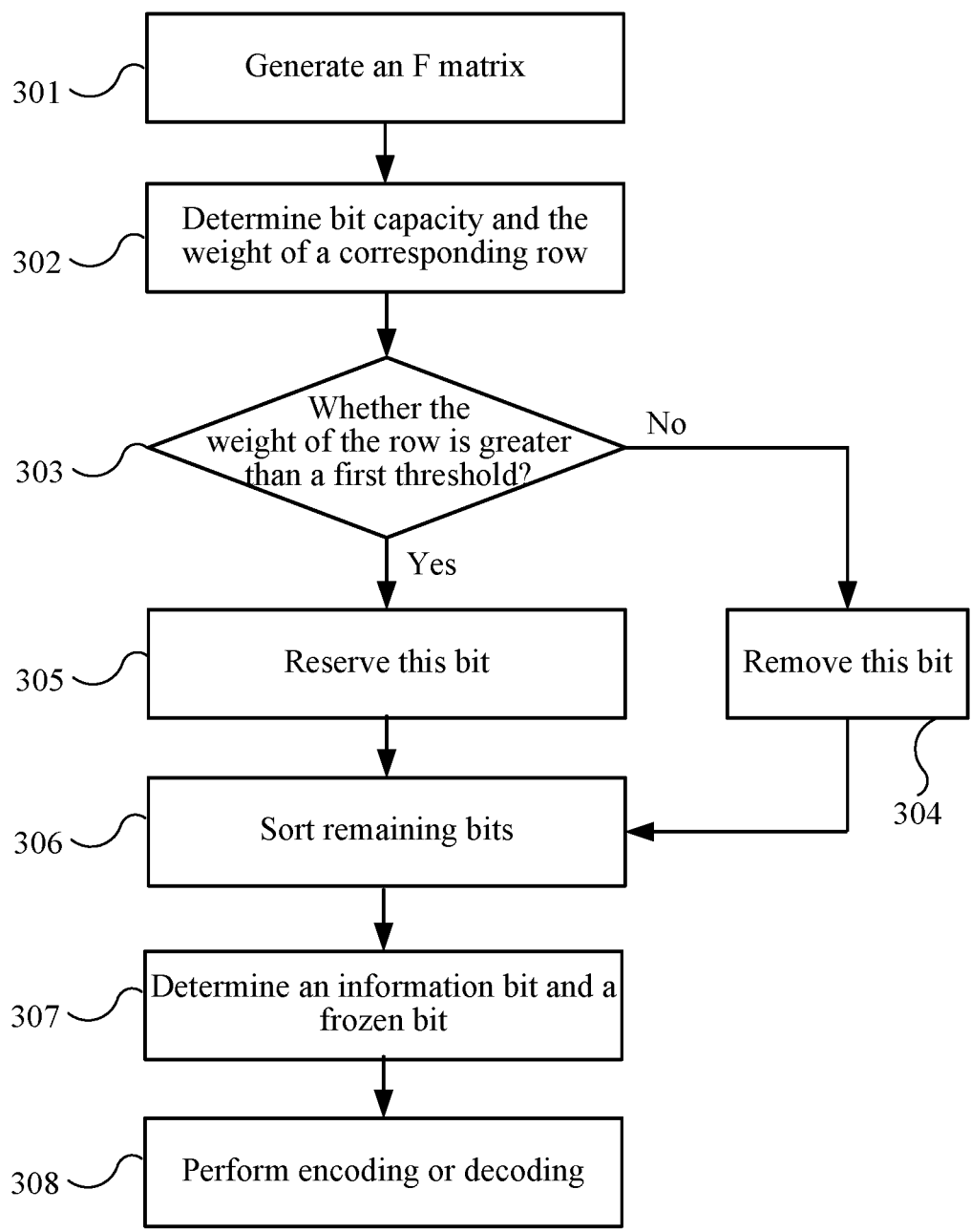
FIG. 3 is a flowchart of a process for generating a hybrid Polar code word according to another embodiment of the present application.

FIG. 3 is a schematic flowchart of a process for generating a hybrid Polar code according to another embodiment of the present application. In an embodiment shown in FIG. 3, bit capacity is used as a measurement of reliability, and when an information bit is to be selected, row weight is considered first, a bit is removed from N bits to obtain remaining bits, where the weight of a row that corresponds to the bit is smaller than or equal to a first threshold, then the remaining bits are sorted according to reliability of the remaining bits, and K bits among the sorted remaining bits are selected, in descending order of the reliability, as information bits.

301: Generate an F matrix of N×N.

302: Determine bit capacity of N bits, and determine the weight of rows that correspond to the N bits.

303: Successively determine whether the weight of a row that corresponds to each bit among the N bits is greater than a first threshold.

304: If it is determined in step 303 that the weight of a row that corresponds to a certain bit is smaller than or equal to the first threshold (a branch "No" of step 303), remove this bit.

305: If it is determined in step 303 that the weight of a row that corresponds to a certain bit is greater than the first threshold (a branch "Yes" of step 303), temporarily reserve this bit. After the N bits have been traversed, remaining bits are obtained. It is assumed that the number of the remaining bits is R, and R is a positive integer not greater than N.

It needs to be noted herein that, if the number of the remaining bits obtained in step 304 and step 305 is smaller than K (R<K), the first threshold may be adjusted. For example, a value of the first threshold is decreased appropriately, and steps 303 to 305 shown in FIG. 3 are executed again, until the number of the obtained remaining bits is greater than or equal to K (R≥K).

306: Sort the R remaining bits according to values of the bit capacity. For example, the R remaining bits may be sorted in descending order of the bit capacity.

307: Among the sorted R remaining bits, select K remaining bits whose bit capacity is the maximum as information bits, and record indexes of the information bits. At the same time, the remaining N−K bits are used as frozen bits. Generally speaking, the frozen bits may be set to 0.

308: After the K information bits and the N−K frozen bits are determined, perform hybrid Polar encoding or decoding.

According to the embodiment of the present application, a bit may be selected as an information bit, where reliability of the bit is high and the weight of a row that corresponds to the bit is greater than a first threshold, so that a minimum code distance of a Polar code can be increased, thereby improving performance of the Polar code. On the other hand, the hybrid Polar code obtained in the embodiment of the present application may achieve better SC or SC-List decoding performance.

Figure 4:
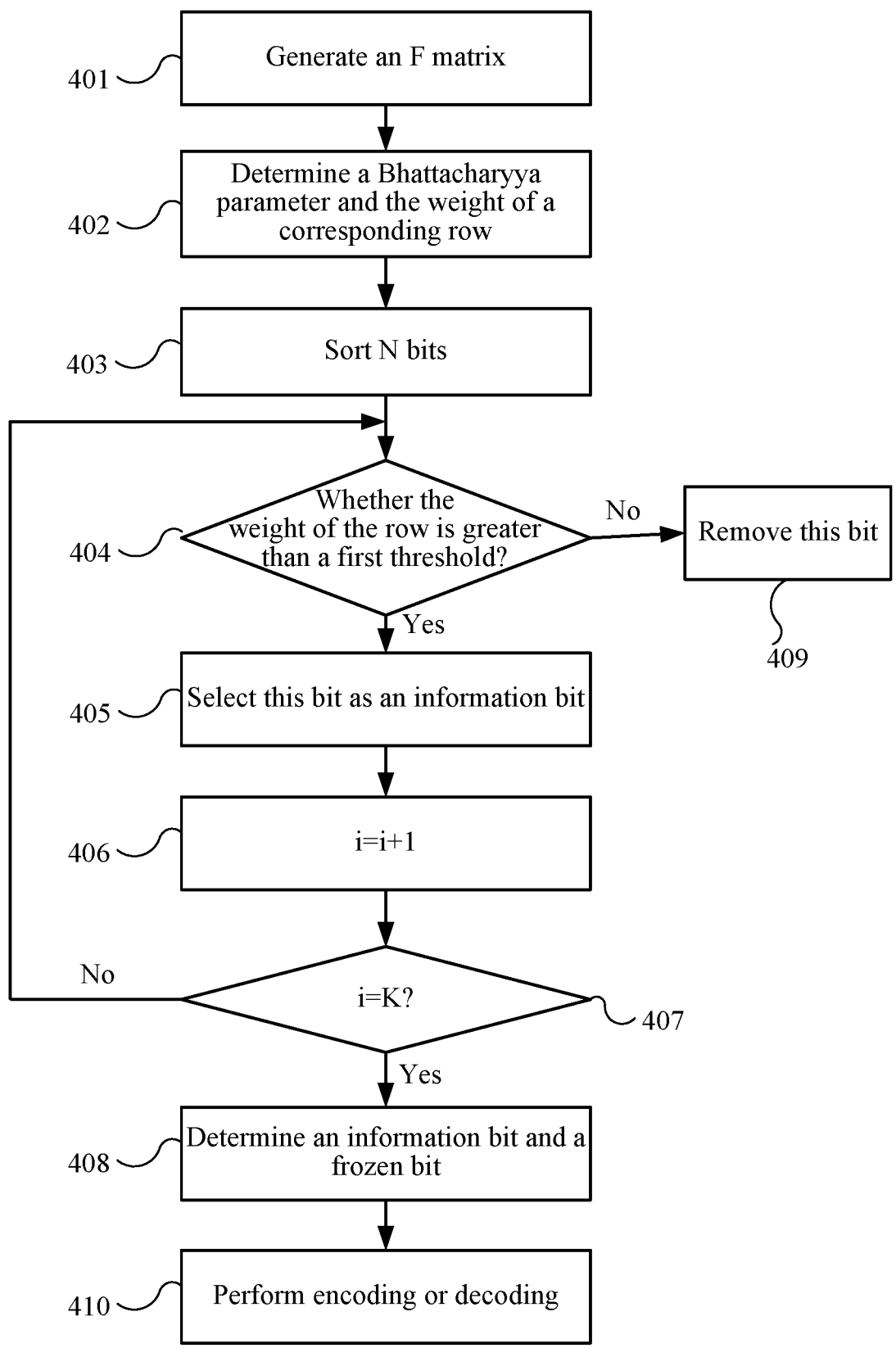
FIG. 4 is a flowchart of a process for generating a hybrid Polar code word according to another embodiment of the present application.

FIG. 4 is a schematic flowchart of a process for generating a hybrid Polar code according to another embodiment of the present application. In an embodiment shown in FIG. 4, a Bhattacharyya parameter is used as a measurement of reliability, and when an information bit is to be selected, reliability is considered first, and N bits are sorted according to the reliability; and then, K bits among the sorted N bits are selected, in descending order of the reliability, as information bits, where the weight of rows that correspond to the K bits is greater than a first threshold.

401: Generate an F matrix of N×N.

402: Determine Bhattacharyya parameters of N bits, and determine the weight of rows that correspond to the N bits.

403: Sort the N bits according to values of the Bhattacharyya parameters. For example, the N bits may be sorted in ascending order of the Bhattacharyya parameters.

404: Among the sorted N bits, successively determine, in the ascending order of the Bhattacharyya parameters, whether the weight of a row that corresponds to each bit is greater than a first threshold.

405: If it is determined in step 404 that the weight of a row that corresponds to a certain bit is greater than the first threshold (a branch "Yes" of step 404), select this bit as an information bit, and record an index of this bit.

406: Increase the number i of selected information bits by 1.

407: Determine whether the number i of the information bits has reached K.

If the number of the information bits has not reached K (a branch "No" of step 407, that is, i<K), go back to step 404, and continue to determine whether the weight of a row that corresponds to a next bit is greater than the first threshold.

408: If the number of the information bits has reached K (a branch "Yes" of step 407, that is, i=K), selection of the information bits has been completed, that is, the K bits recorded in step 405 are used as the information bits. At the same time, the remaining N−K bits are used as frozen bits.

409: If it is determined in step 404 that the weight of a row that corresponds to a certain bit is smaller than or equal to the first threshold (a branch "No" of step 404), remove this bit, and do not use this bit as an information bit. In other words, this bit is recorded as a frozen bit in step 408. Generally speaking, the frozen bit may be set to 0.

410: After the K information bits and the N−K frozen bits are determined, perform hybrid Polar encoding or decoding.

According to the embodiment of the present application, a bit may be selected as an information bit, where reliability of the bit is high and the weight of a row that corresponds to the bit is greater than a first threshold, so that a minimum code distance of a Polar code can be increased, thereby improving performance of the Polar code. On the other hand, the hybrid Polar code obtained in the embodiment of the present application may achieve better SC or SC-List decoding performance.

In addition, it needs to be noted that, in step 408, if the N bits have been traversed, but the number of obtained information bits still does not reach K (i<K), the first threshold may be adjusted. For example, a value of the first threshold is decreased appropriately, and the method shown in FIG. 4 is executed again, until the number of the obtained information bits can reach K.

Figure 5:
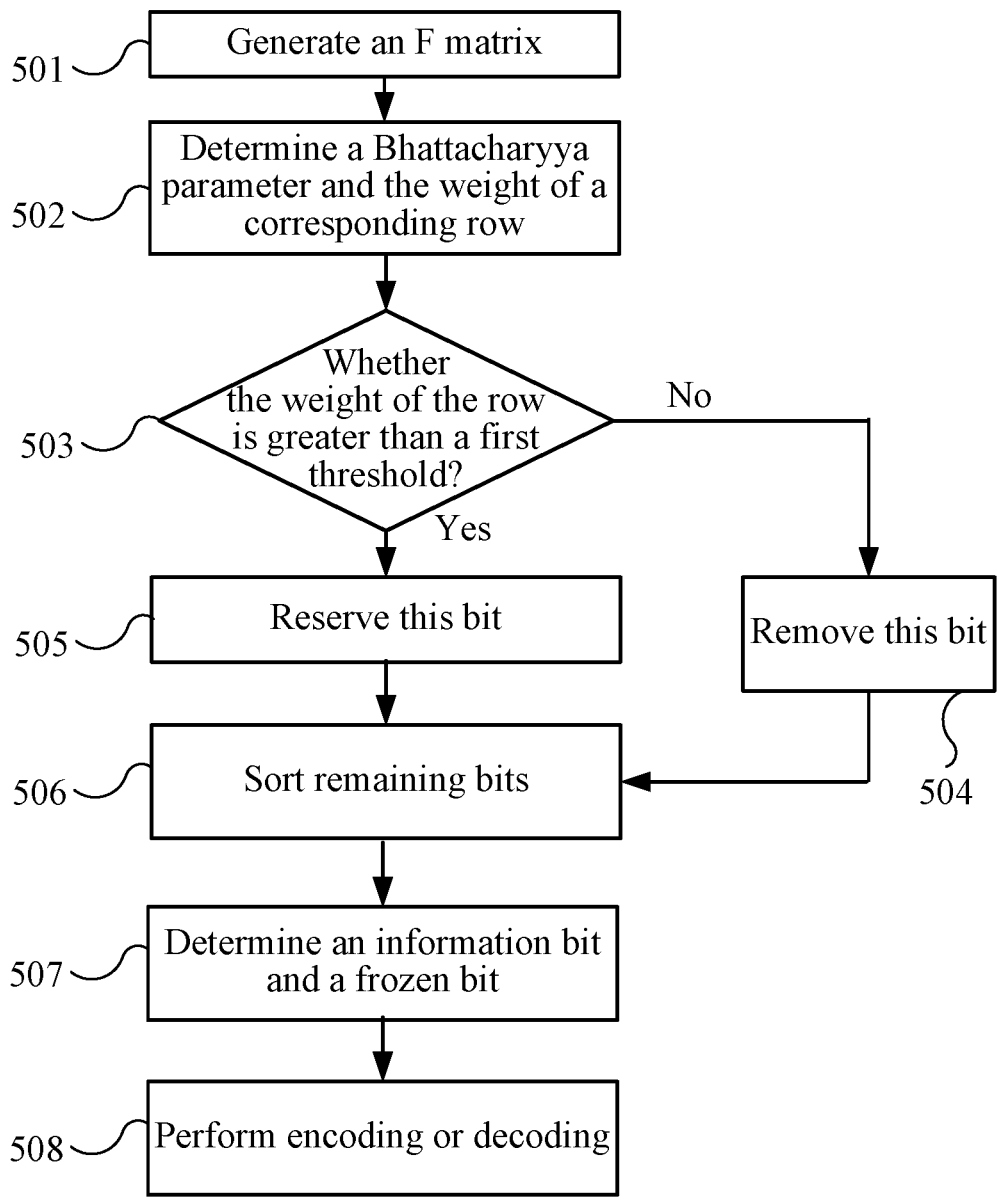
FIG. 5 is a flowchart of a process for generating a hybrid Polar code word according to another embodiment of the present application.

FIG. 5 is a schematic flowchart of a process for generating a hybrid Polar code according to another embodiment of the present application. In an embodiment shown in FIG. 5, a Bhattacharyya parameter is considered as a measurement of reliability, and when an information bit is to be selected, row weight is considered first, a bit is removed from N bits to obtain remaining bits, where the weight of a row that corresponds to the bit is smaller than or equal to a first threshold, then the remaining bits are sorted according to reliability of the remaining bits, and K bits among the sorted remaining bits are selected, in descending order of the reliability, as information bits.

501: Generate an F matrix of N×N.

502: Determine Bhattacharyya parameters of N bits, and determine the weight of rows that correspond to the N bits.

503: Successively determine whether the weight of a row that corresponds to each bit among the N bits is greater than a first threshold.

504: If it is determined in step 503 that the weight of a row that corresponds to a certain bit is smaller than or equal to the first threshold (a branch "No" of step 503), remove this bit.

505: If it is determined in step 503 that the weight of a row that corresponds to a certain bit is greater than the first threshold (a branch "Yes" of step 503), temporarily reserve this bit. After the N bits have been traversed, remaining bits are obtained. It is assumed that the number of the remaining bits is R, and R is a positive integer not greater than N.

It needs to be noted herein that, if the number of the remaining bits obtained in step 504 and step 505 is smaller than K (R<K), the first threshold may be adjusted. For example, a value of the first threshold is decreased appropriately, and steps 503 to 505 shown in FIG. 5 are executed again, until the number of the obtained remaining bits is greater than or equal to K (R≥K).

506: Sort the R remaining bits according to values of the Bhattacharyya parameters. For example, the R remaining bits may be sorted in ascending order of the Bhattacharyya parameters.

507: Among the sorted R remaining bits, select K remaining bits whose Bhattacharyya parameter is the minimum as information bits, and record indexes of the information bits. At the same time, the remaining N-K bits are used as frozen bits. Generally speaking, the frozen bits may be set to 0.

508: After the K information bits and the N-K frozen bits are determined, perform hybrid Polar encoding or decoding.

According to the embodiment of the present application, a bit may be selected as an information bit, where reliability of the bit is high and the weight of a row that corresponds to the bit is greater than a first threshold, so that a minimum code distance of a Polar code can be increased, thereby improving performance of the Polar code. At the same time, the hybrid Polar code obtained in the embodiment of the present application may achieve better SC or SC-List decoding performance.

For another measurement of reliability, if a larger value of the measurement corresponds to higher reliability, an information bit may be selected in the manner shown in FIG. 2 and FIG. 4; and if a larger value of the measurement corresponds to lower reliability, an information bit may be selected in the manner shown in FIG. 3 and FIG. 5. For example, if an error probability is used to indicate reliability, an information bit may be selected in a manner similar to that in FIG. 3 and FIG. 5.

In examples shown in FIG. 6 to FIG. 9, K rows are directly selected to construct a second matrix. That is, K rows among N rows of a first matrix are selected to construct a second matrix, where reliability of bits that correspond to the K rows is high and the weight of the rows is greater than a first threshold, but the embodiments of the present application are not limited to this; or N-K rows that are not required for a second matrix may be selected first, and the remaining K rows are used to construct the second matrix. In this case, a manner of selecting the N-K rows may be opposite to a manner of selecting the K rows. For example, N-K rows among N bits are selected, where reliability of bits that correspond to the N-K rows is low or the weight of the rows is smaller than or equal to a first threshold.

Figure 6:
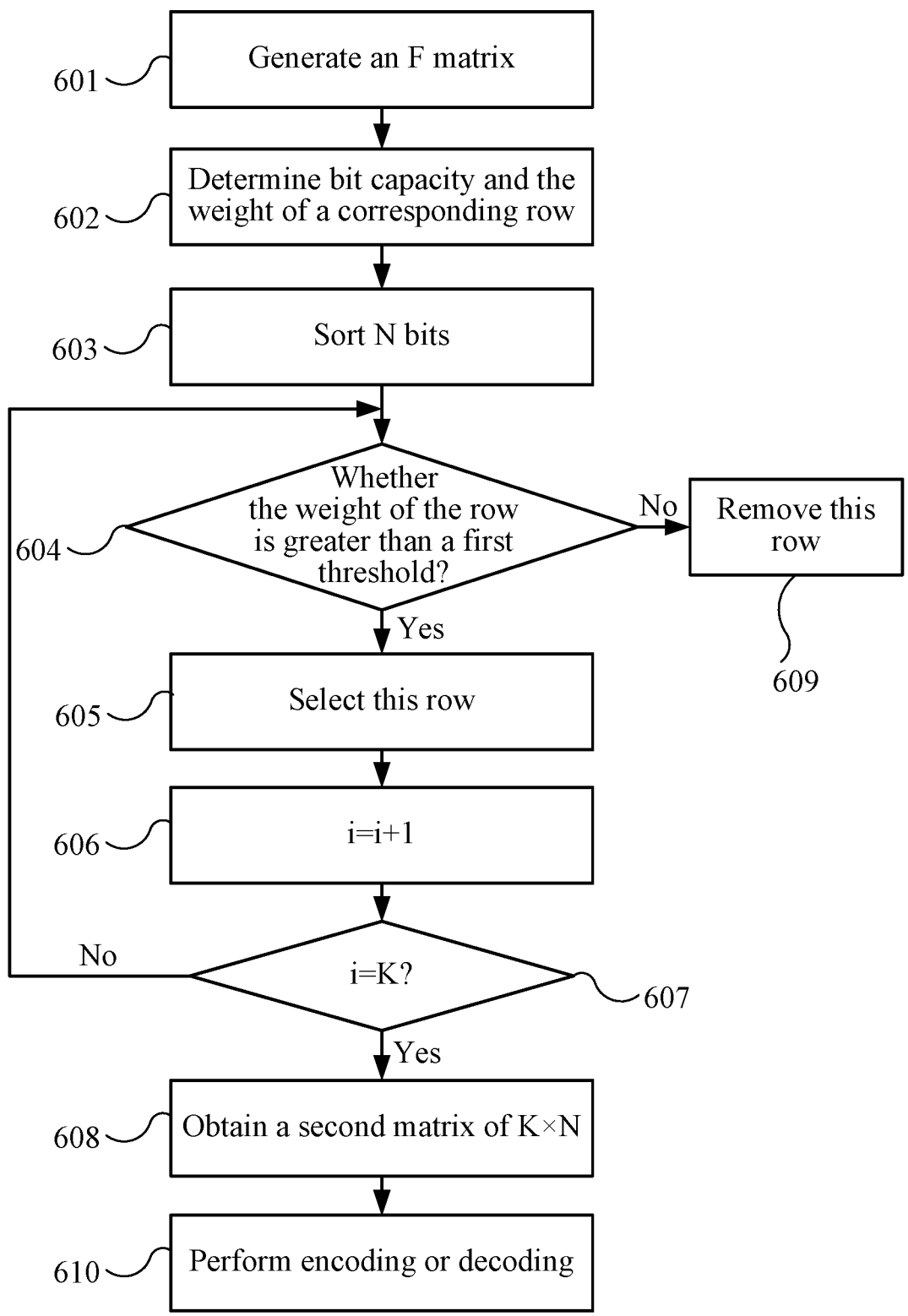
FIG. 6 is a flowchart of a process for generating a code word of a hybrid Polar code according to another embodiment of the present application.

FIG. 6 is a schematic flowchart of a process for generating a hybrid Polar code according to another embodiment of the present application. In an embodiment shown in FIG. 6, bit capacity is used as a measurement of reliability, and when K rows of a second matrix are to be selected, reliability is considered first, and N rows of a first matrix are sorted according to reliability of corresponding bits; and then the K rows among the sorted N rows are selected in descending order of the reliability of the corresponding bits to construct the second matrix, where the weight of the rows is greater than a first threshold.

601: Generate an F matrix of N×N.

602: Determine bit capacity of N bits, and determine the weight of N rows.

603: Sort, according to values of the bit capacity, the N rows corresponding to the N bits. For example, the N rows may be sorted in descending order of the bit capacity.

604: Among the sorted N rows, successively determine, in the descending order of the bit capacity, whether the weight of each row is greater than a first threshold.

605: If it is determined in step 604 that the weight of a certain row is greater than the first threshold (a branch "Yes" of step 604), select this row.

606: Increase the number i of selected rows by 1.

607: Determine whether the number i of the selected rows has reached K.

If the number of the rows has not reached K (a branch "No" of step 607, that is, i<K), go back to step 604, and continue to determine whether the weight of a next row is greater than the first threshold.

608: If the number of the selected rows has reached K (a branch "Yes" of step 607, that is, i=K), selection of the K rows has been completed, and a second matrix of K×N is obtained.

609: If it is determined in step 604 that the weight of a certain row is smaller than or equal to the first threshold (a branch "No" of step 604), remove this row.

610: After the second matrix of K×N is obtained, perform hybrid Polar encoding or decoding.

According to the embodiment of the present application, a row may be selected to construct a second matrix, where reliability of a bit that corresponds to the row is high and the weight of the row is greater than a first threshold, so that a minimum code distance of a Polar code can be increased, thereby improving performance of the Polar code. On the other hand, the hybrid Polar code obtained in the embodiment of the present application may achieve better SC or SC-List decoding performance.

In addition, it needs to be noted that, in step 608, if the N rows have been traversed, but the number of selected rows still does not reach K (i<K), the first threshold may be adjusted. For example, a value of the first threshold is decreased appropriately, and the method shown in FIG. 6 is executed again, until the number of the selected rows can reach K.

Figure 7:
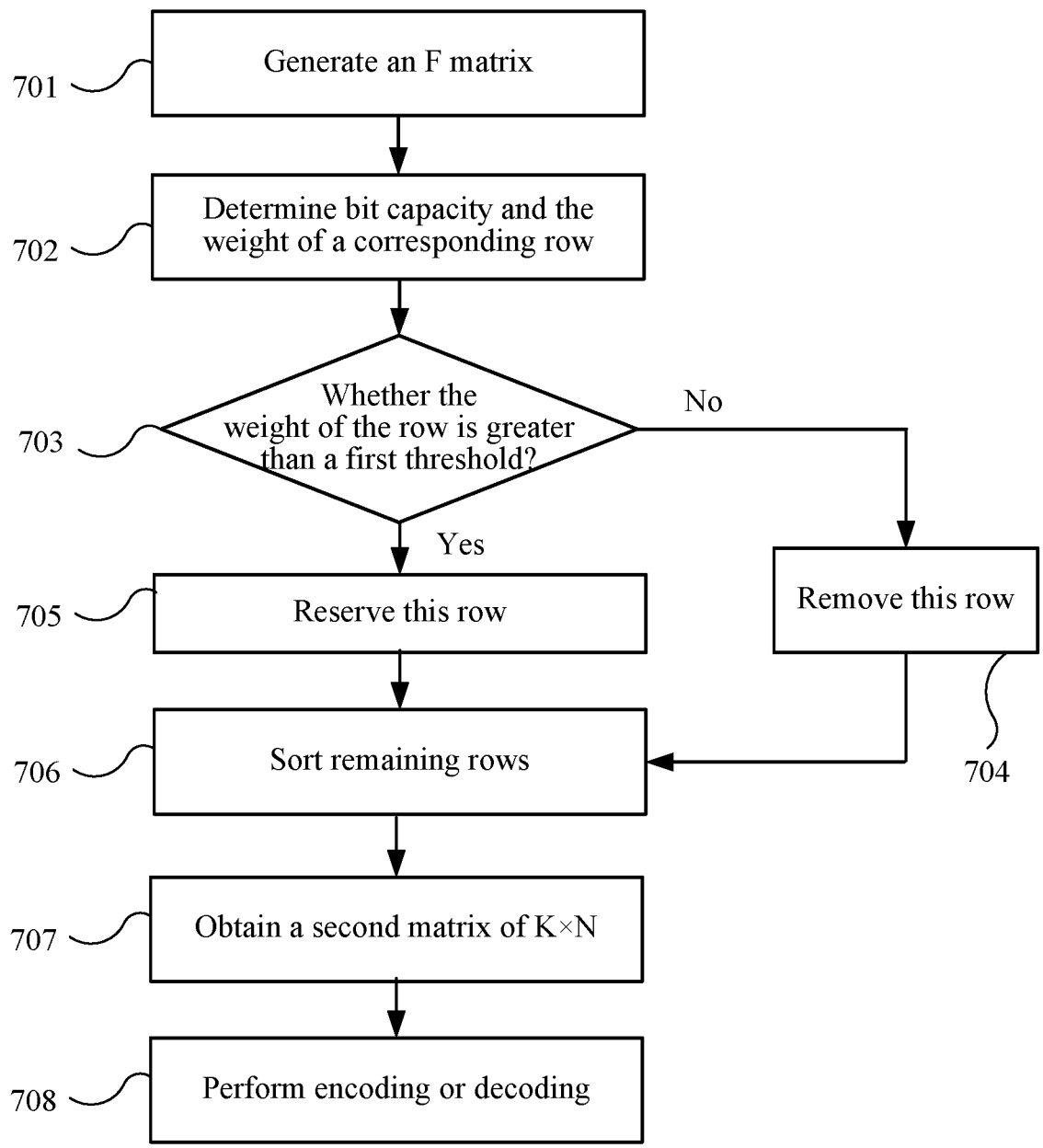
FIG. 7 is a flowchart of a process for generating a code word of a hybrid Polar code according to another embodiment of the present application.

FIG. 7 is a schematic flowchart of a process for generating a hybrid Polar code according to another embodiment of the present application. In an embodiment shown in FIG. 7, bit capacity is used as a measurement of reliability, and when K rows of a second matrix are to be selected, row weight is considered first, a row of which the weight is smaller than or equal to a first threshold is removed to obtain remaining rows; and the remaining rows are sorted according to reliability of bits that correspond to the remaining rows, and K rows among the sorted remaining rows are selected in descending order of the reliability of the corresponding bits to construct a second matrix.

701: Generate an F matrix of N×N.

702: Determine bit capacity of N bits, and determine the weight of N rows.

703: Successively determine whether the weight of each row in the N rows is greater than a first threshold.

704: If it is determined in step 703 that the weight of a certain row is smaller than or equal to the first threshold (a branch "No" of step 703), remove this row.

705: If it is determined in step 703 that the weight of a certain row is greater than the first threshold (a branch "Yes" of step 703), temporarily reserve this row. After the N rows have been traversed, remaining rows are obtained. It is assumed that the number of the remaining rows is R, and R is a positive integer not greater than N.

It needs to be noted herein that, if the number of the remaining rows obtained in step 704 and step 705 is smaller than K (R<K), the first threshold may be adjusted. For example, a value of the first threshold is decreased appropriately, and steps 703 to 705 shown in FIG. 7 are executed again, until the number of the obtained remaining rows is greater than or equal to K (R≥K).

706: Sort the R remaining rows according to values of bit capacity of corresponding bits. For example, the R remaining rows may be sorted in descending order of the bit capacity.

707: Among the sorted R remaining rows, select K remaining rows corresponding to bits whose bit capacity is the maximum, to obtain a second matrix of K×N.

708: After the second matrix is obtained, perform hybrid Polar encoding or decoding.

According to the embodiment of the present application, a row may be selected to construct a second matrix, where reliability of a bit that corresponds to the row is high and the weight of the row is greater than a first threshold, so that a minimum code distance of a Polar code can be increased, thereby improving performance of the Polar code. On the other hand, the hybrid Polar code obtained in the embodiment of the present application may achieve better SC or SC-List decoding performance.

Figure 8:
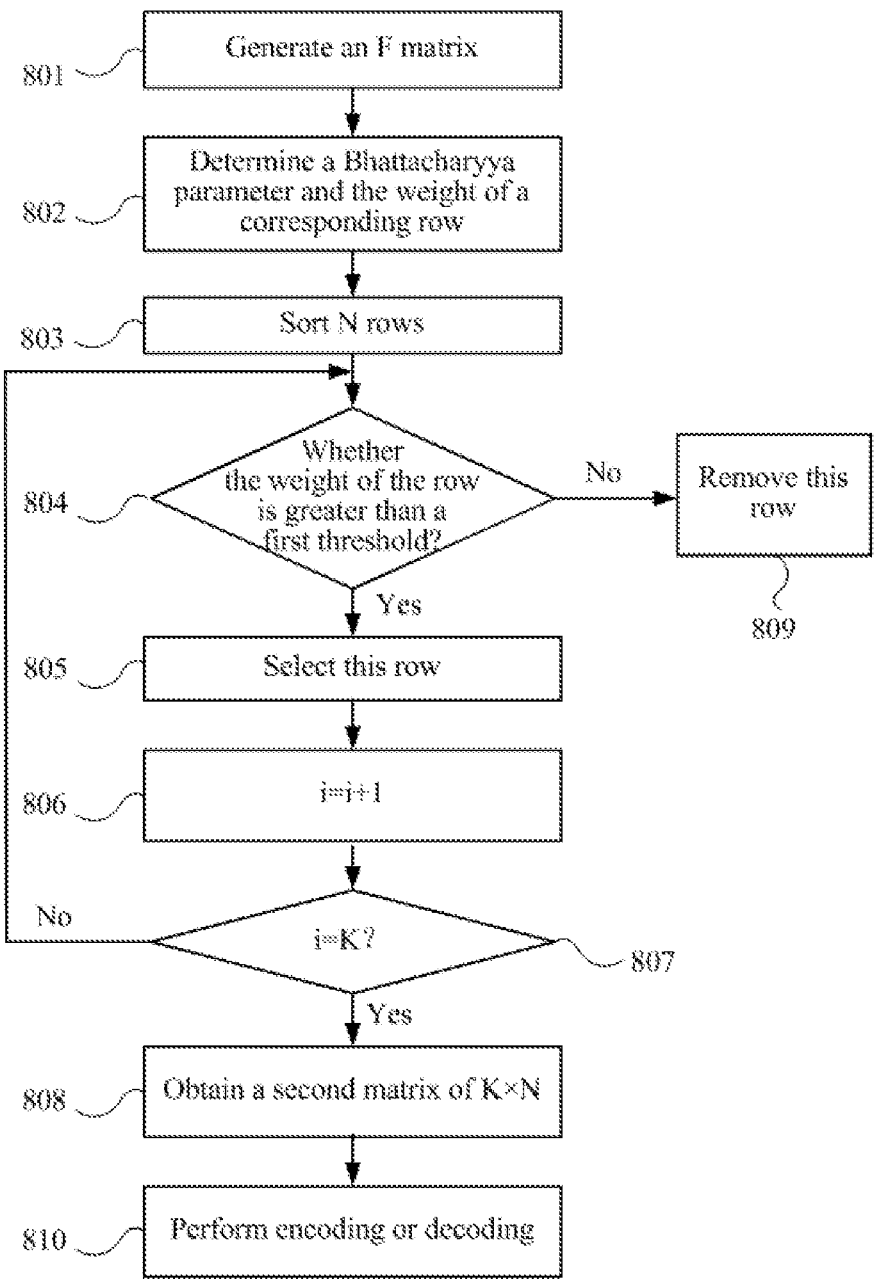
FIG. 8 is a flowchart of a process for generating a code word of a hybrid Polar code according to another embodiment of the present application.

FIG. 8 is a schematic flowchart of a process for generating a hybrid Polar code according to another embodiment of the present application. In an embodiment shown in FIG. 8, a Bhattacharyya parameter is used as a measurement of reliability, and when an information bit is to be selected, reliability is considered first, and N rows of a first matrix are sorted according to reliability of corresponding bits; and then K rows among the sorted N rows are selected in descending order of the reliability of the corresponding bits to construct a second matrix, where the weight of the rows is greater than a first threshold.

801: Generate an F matrix of N×N.

802: Determine Bhattacharyya parameters of N bits, and determine the weight of N rows.

803: Sort, according to values of the Bhattacharyya parameters, the N rows corresponding to the N bits. For example, the N rows may be sorted in ascending order of the Bhattacharyya parameters.

804: Among the sorted N rows, successively determine, in the ascending order of the Bhattacharyya parameters, whether the weight of each row is greater than a first threshold.

805: If it is determined in step 804 that the weight of a certain row is greater than the first threshold (a branch "Yes" of step 804), select this row.

806: Increase the number i of selected rows by 1.

807: Determine whether the number i of the selected rows has reached K.

If the number of the selected rows has not reached K (a branch "No" of step 807, that is, i<K), go back to step 804, and continue to determine whether the weight of a next row is greater than the first threshold.

808: If the number of the selected rows has reached K (a branch "Yes" of step 807, that is, i=K), selection of the K rows has been completed, and a second matrix of K×N is obtained.

809: If it is determined in step 804 that the weight of a certain row is smaller than or equal to the first threshold (a branch "No" of step 804), remove this row.

810: After the second matrix of K×N is obtained, perform hybrid Polar encoding or decoding.

According to the embodiment of the present application, a row may be selected to construct a second matrix, where reliability of a bit that corresponds to the row is high and the weight of the row is greater than a first threshold, so that a minimum code distance of a code word can be increased, thereby improving performance of the code word. At the same time, a code word obtained in the embodiment of the present application may achieve better SC or SC-List decoding performance.

In addition, it needs to be noted that, in step 808, if the N rows have been traversed, but the number of selected rows still does not reach K (i<K), the first threshold may be adjusted. For example, a value of the first threshold is decreased appropriately, and the method shown in FIG. 8 is executed again, until the number of the selected rows can reach K.

Figure 9:
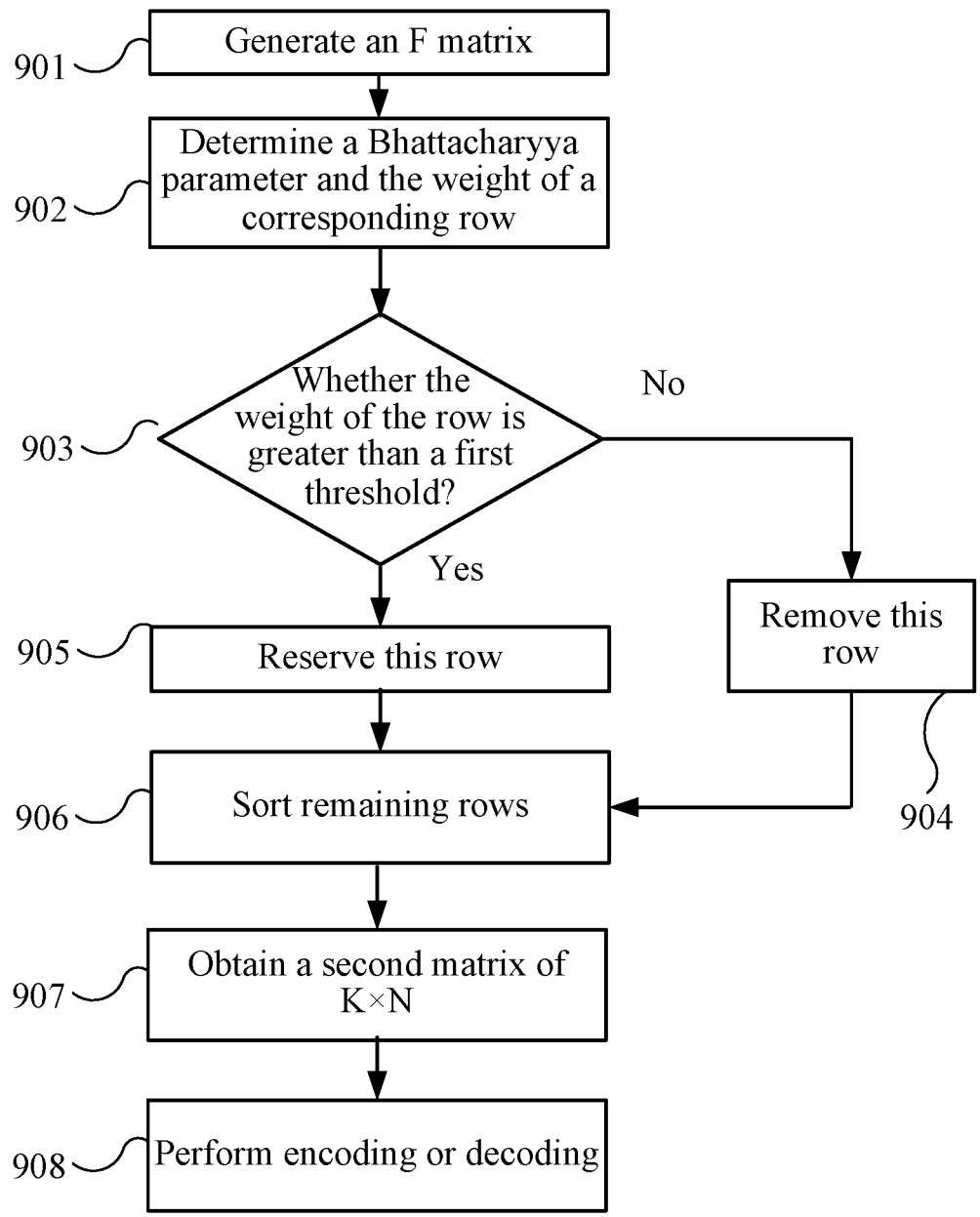
FIG. 9 is a flowchart of a process for generating a code word of a hybrid Polar code according to another embodiment of the present application.

FIG. 9 is a schematic flowchart of a process for generating a hybrid Polar code according to another embodiment of the present application. In an embodiment shown in FIG. 9, a Bhattacharyya parameter is used as a measurement of reliability, and when K rows of a second matrix are to be selected, row weight is considered first, a row of which the weight is smaller than or equal to a first threshold is removed to obtain remaining rows; and the remaining rows are sorted according to reliability of bits that correspond to the remaining rows, and K rows among the sorted remaining rows are selected in descending order of the reliability of the corresponding bits to construct a second matrix.

901: Generate an F matrix of N×N.

902: Determine Bhattacharyya parameters of N bits, and determine the weight of N rows.

903: Successively determine whether the weight of each row in the N rows is greater than a first threshold.

904: If it is determined in step 903 that the weight of a certain row is smaller than or equal to the first threshold (a branch "No" of step 903), remove this row.

905: If it is determined in step 903 that the weight of a certain row is greater than the first threshold (a branch "Yes" of step 903), temporarily reserve this row. After the N rows have been traversed, remaining rows are obtained. It is assumed that the number of the remaining rows is R, and R is a positive integer not greater than N.

It needs to be noted herein that, if the number of the remaining rows obtained in step 904 and step 905 is smaller than K (R<K), the first threshold may be adjusted. For example, a value of the first threshold is decreased appropriately, and steps 903 to 905 shown in FIG. 9 are executed again, until the number of the obtained remaining rows is greater than or equal to K (R≥K).

906: Sort the R remaining rows according to values of Bhattacharyya parameters of corresponding bits. For example, the R remaining rows may be sorted in ascending order of the Bhattacharyya parameters.

907: Among the sorted R remaining rows, select K remaining rows whose Bhattacharyya parameter is the minimum, to obtain a second matrix of K×N.

908: After the second matrix of K×N is obtained, perform hybrid Polar encoding or decoding.

According to the embodiment of the present application, a row may be selected to construct a second matrix, where reliability of a bit that corresponds to the row is high and the weight of the row is greater than a first threshold, so that a minimum code distance of a Polar code can be increased, thereby improving performance of the Polar code. On the other hand, the hybrid Polar code obtained in the embodiment of the present application may achieve better SC or SC-List decoding performance.

For another measurement of reliability, if a larger value of the measurement corresponds to higher reliability, an information bit may be selected in the manner shown in FIG. 6 and FIG. 8; and if a larger value of the measurement corresponds to lower reliability, an information bit may be selected in the manner shown in FIG. 7 and FIG. 9. For example, if an error probability is used to indicate reliability, an information bit may be selected in a manner similar to that in FIG. 7 and FIG. 9.

In the embodiment of the present application, both reliability and row weight are considered, so that a hybrid Polar code whose minimum code distance is better can be obtained. By using N=2048 and K=1024 as an example, after existing Polar codes are sorted in descending order of capacity, 1024 bits with the maximum capacity are 1024 bits from left to right, therefore, which is selected as information bits. However, the weight of rows that correspond to the latter several information bits among the selected information bits is 16. A minimum code distance of the existing Polar codes is 16. According to the hybrid Polar code in the embodiment of the present application, it may be set that the minimum weight of a row that corresponds to each bit is not smaller than 16 (that is, a first threshold is set to 16). Therefore, a bit whose row weight is smaller than or equal to 16 can be removed, and the 1024 bits with the maximum capacity are selected from only remaining bits as the information bits. No weight of rows that correspond to the selected information bits is smaller than 16 but the weight of the rows is smaller than 32. A minimum code distance of the hybrid Polar code obtained in the embodiment of the present application is 32, and the hybrid Polar code has better performance.

Decoding performance of the existing Polar code and decoding performance of the hybrid Polar code in the embodiment of the present application in the case of the same SC-List decoding are compared. L=32 is taken as the number of survivor paths of the SC-List decoding, it may be found that the hybrid Polar code is better than the existing Polar code. For example, when an energy to noise ratio (Eb/No) is 1.6 dB, a frame error ratio (FER) of the hybrid Polar code is lower than $10^{-3}$, but an FER of the existing Polar code can only reach a magnitude of $10^{-2}$ in the same condition. In addition, for the existing Polar code, the SC-List decoding has reached an optimal ML decoding bound (ML Bound), and performance of the SC-List decoding cannot be further improved, but an optimal ML decoding bound of the hybrid Polar code in the embodiment of the present application is far better than that of the existing Polar code. For example, an optimal ML decoding bound of the FER of the hybrid Polar code in the embodiment of the present application can basically reach a magnitude of $10^{-4}$ when the energy to noise ratio is 1.6 dB. Therefore, the performance of the hybrid Polar code in the embodiment of the present application still can be improved greatly. For example, the optimal decoding ML bound may be reached by continuously increasing the number L of the survivor paths.

Figure 10:
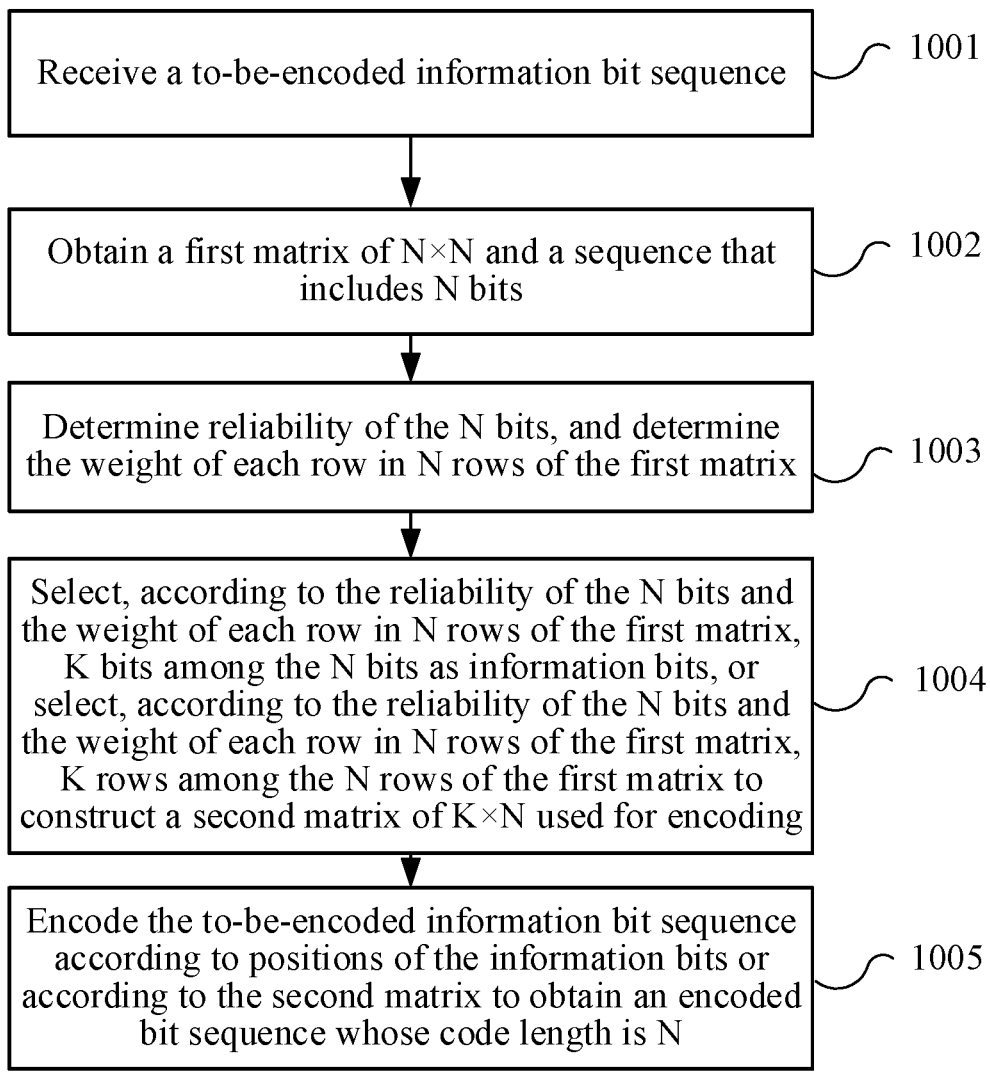
FIG. 10 is a flowchart of an encoding method according to an embodiment of the present application.

FIG. 10 is a flowchart of an encoding method according to an embodiment of the present application. The method shown in FIG. 10 is executed by an encoding end.

1001: Receive a to-be-encoded information bit sequence, where the length of the information bit sequence is K and K is a positive integer.

1002: Obtain a first matrix of N×N and a sequence that includes N bits, where N is a code length of a hybrid Polar code to be generated, N rows of the first matrix correspond to the N bits in the sequence in a one-to-one manner, and N is a positive integer greater than or equal to K.

1003: Determine reliability of the N bits, and determine the weight of each row in the N rows of the first matrix.

1004: Select, according to the reliability of the N bits and the weight of each row in the N rows of the first matrix, K bits among the N bits as information bits, or select, according to the reliability of the N bits and the weight of each row in the N rows of the first matrix, K rows among the N rows of the first matrix to construct a second matrix of K×N used for encoding.

For steps 1002 to 1004, reference may be made to steps 101 to 103 shown in FIG. 1, and therefore description is not repeated.

1005: Encode the to-be-encoded information bit sequence according to positions of the information bits or according to the second matrix to obtain an encoded bit sequence whose code length is N.

For example, when the K information bits are determined in step 1004, positions in $u_1^N$ of K bits of the information bit sequence may be determined, so that the encoding may be performed according to $x_1^N = u_1^N G_N$.

As another embodiment, when the second matrix of K×N (for example, $G_N(A)$ or a variant of $G_N(A)$) is determined in step 1004, the encoding may be performed according to $x_1^N = u_A G_N(A)$, where $u_A$ indicates the to-be-encoded information bit sequence that is received in step 1001.

In a case where frozen bits are set to 0 ($u_{A^c}=0$), encoding results $x_1^N = u_1^N G_N$ and $x_1^N = u_A G_N(A)$ are the same.

In the embodiment of the present application, when an information bit or an encoding matrix of a hybrid Polar code is selected, not only reliability of a bit is considered, but also the weight of a row that is of a matrix and corresponds to the bit is considered, so that performance of a code word can be improved.

In addition, the hybrid Polar code obtained in the embodiment of the present application is also applied to SC or SC-List decoding, which can achieve better decoding performance and is an optimized Polar code.

In addition, the code length N and the number K of the information bits are both values that may be preset. That is, a code rate of a hybrid Polar code obtained according to the embodiment of the present application is variable. The code rate is determined by K and N, for example, K/N.

It should be noted that, an order for executing each step shown in FIG. 10 is not intended to limit the scope of the embodiments of the present application. A person skilled in the art may change the order for executing each step shown in FIG. 10. For example, step 1001 may be executed after steps 1002 to 1004, or be executed synchronously with steps 1002 to 1004. Such changes all fall within the scope of the embodiments of the present application.

Figure 11:
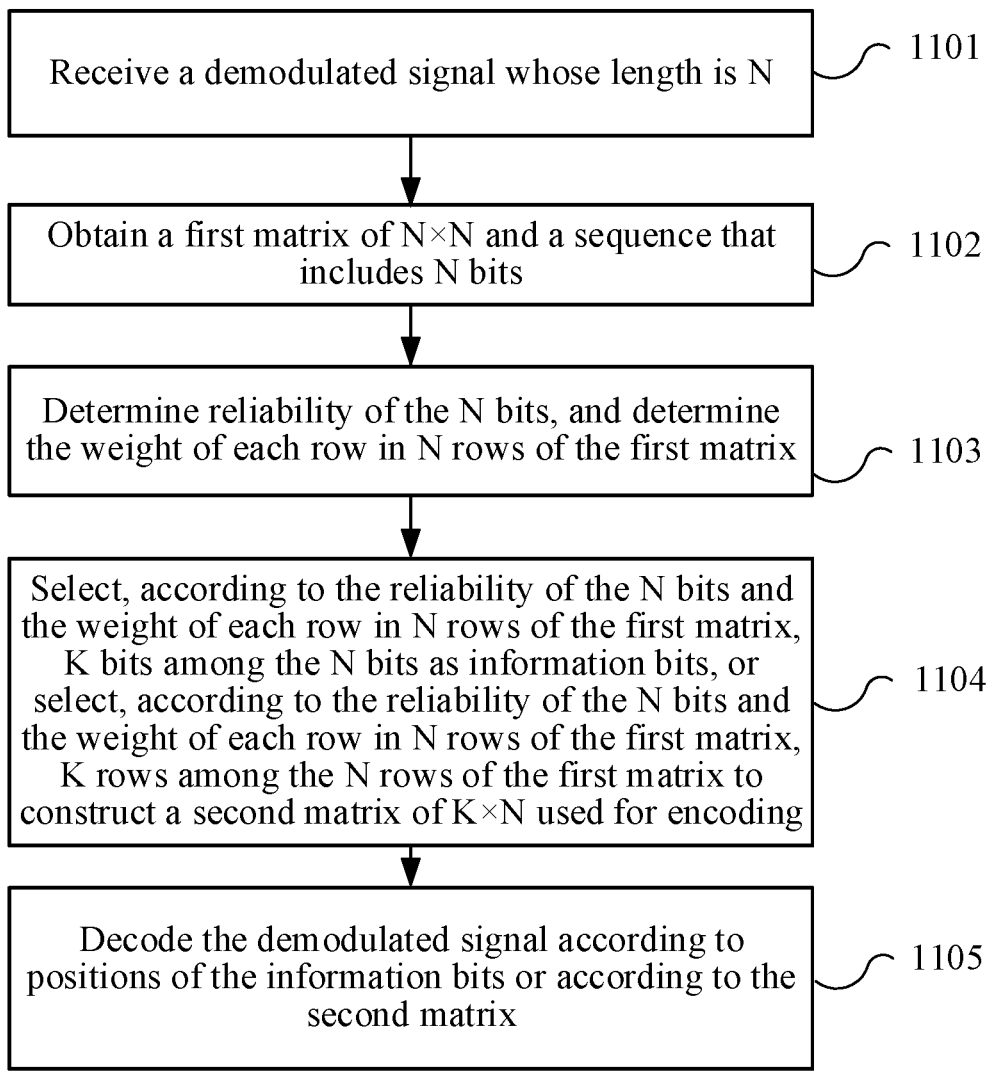
FIG. 11 is a flowchart of a decoding method according to an embodiment of the present application.

FIG. 11 is a flowchart of a decoding method according to an embodiment of the present application. The method shown in FIG. 11 is executed by a decoding end.

1101: Receive a demodulated signal whose length is N.

1102: Obtain a first matrix of N×N and a sequence that includes N bits, where N rows of the first matrix correspond to the N bits in the sequence in a one-to-one manner.

1103: Determine reliability of the N bits, and determine the weight of each row in the N rows of the first matrix.

1104: Select, according to the reliability of the N bits and the weight of each row in the N rows of the first matrix, K bits among the N bits as information bits, or select, according to the reliability of the N bits and the weight of each row in the N rows of the first matrix, K rows among the N rows of the first matrix to construct a second matrix of K×N used for encoding, where K is a positive integer not greater than N.

For steps 1102 to 1104, reference may be made to steps 101 to 103 shown in FIG. 1, and therefore description is not repeated.

1105: Decode the demodulated signal according to positions of the information bits or according to the second matrix.

In the embodiment of the present application, a specific manner of decoding is not limited. For example, SC or SC-List decoding may be used to generate a decoded bit sequence whose length is K.

In the embodiment of the present application, when an information bit or an encoding matrix of a hybrid Polar code is selected, not only reliability of a bit is considered, but also the weight of a row that is of a matrix and corresponds to the bit is considered, so that performance of a code word can be improved.

In addition, the hybrid Polar code obtained in the embodiment of the present application is also applied to SC or SC-List decoding, which can achieve better decoding performance and is an optimized Polar code.

In addition, the code length N and the number K of the information bits are both values that may be preset. That is, a code rate of a hybrid Polar code obtained according to the embodiment of the present application is variable. The code rate is determined by K and N, for example, K/N.

An order for executing each step shown in FIG. 11 is not intended to limit the scope of the embodiments of the present application. A person skilled in the art may change the order for executing each step shown in FIG. 11. For example, step 1101 may be executed after steps 1102 to 1104, or be executed synchronously with steps 1102 to 1104. Such changes all fall within the scope of the embodiments of the present application.

Figure 12:
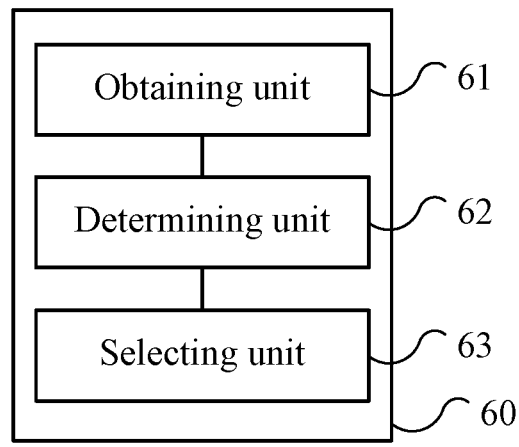
FIG. 12 is a block diagram of an apparatus for generating a hybrid Polar code according to an embodiment of the present application.

FIG. 12 is a block diagram of an apparatus for generating a hybrid Polar code according to an embodiment of the present application. An apparatus 60 shown in FIG. 12 includes an obtaining unit 61, a determining unit 62, and a selecting unit 63.

The obtaining unit 61 generates a first matrix of N×N and a sequence that includes N bits, where N is a code length, N rows of the first matrix correspond to the N bits in the sequence in a one-to-one manner, and N is a positive integer.

The determining unit 62 determines reliability of N bits, and determines the weight of each row in the N rows of the first matrix.

The selecting unit 63 selects, according to the reliability of the N bits and the weight of each row in the N rows of the first matrix, K bits among the N bits as information bits, or selects, according to the reliability of the N bits and the weight of each row in the N rows of the first matrix, K rows among the N rows of the first matrix to construct a second matrix of K×N used for encoding, so as to encode a to-be-encoded information bit sequence according to positions of the information bits or the second matrix to generate the hybrid Polar code, where K is the length of the to-be-encoded information bit sequence and is a positive integer not greater than N.

In the embodiment of the present application, when an information bit or an encoding matrix of a hybrid Polar code is selected, not only reliability of a bit is considered, but also the weight of a row that is of a matrix and corresponds to the bit is considered, so that performance of the Polar code can be improved.

In addition, the hybrid Polar code obtained in the embodiment of the present application is also applied to SC or SC-List decoding, which can achieve better decoding performance and is an optimized Polar code.

The apparatus 60 shown in FIG. 12 can implement each step of the method shown in FIG. 1 to FIG. 9. To avoid repetition, detailed description is not repeated. The apparatus 60 may be located in any network element, for example, may be located in a user equipment or a base station.

Optionally, as an embodiment, the obtaining unit 61 may generate the first matrix according to a value of N, for example, may generate the foregoing matrix $G_N$ or a variant (for example, $F^{\otimes n}$) of the $G_N$ as the first matrix. Alternatively, the obtaining unit 61 may read the first matrix that is prestored and corresponds to a value of N. In other words, a first matrix corresponding to a different value of N may be prestored locally.

Optionally, as another embodiment, the obtaining unit 61 may generate the sequence of 1×N according to a value of N, for example, $u_1^N$ in the foregoing. The sequence is a set including information bits and frozen bits. Alternatively, the obtaining unit 61 may read the prestored sequence of 1×N. In other words, a sequence $u_1^N$ corresponding to a different value of N may be prestored locally.

Optionally, as an embodiment, the selecting unit 63 may select the K bits among the N bits as the information bits, where reliability of the K bits is high and the weight of rows that are of the first matrix and correspond to the K bits is greater than a first threshold. The information bits selected in this way have a larger minimum code distance, thereby improving performance of a Polar code.

Optionally, as an embodiment, the determining unit 62 may determine capacity of each bit among the N bits, where reliability of a bit with larger capacity is higher; or determine a Bhattacharyya parameter of each bit among the N bits, where reliability of a bit with a smaller Bhattacharyya parameter is higher; or determine an error probability of each bit among the N bits, where reliability of a bit with a smaller error probability is higher.

Optionally, as another embodiment, the selecting unit 63 may sort the N bits according to the reliability, and select, in descending order of the reliability, the K bits among the sorted N bits as the information bits, where the weight of the rows that are of the first matrix and correspond to the K bits is greater than the first threshold. For example, the selecting unit 63 may select the information bits according to the method shown in FIG. 2 and FIG. 4.

Optionally, as another embodiment, the selecting unit 63 may remove a bit from the N bits to obtain remaining bits, where the weight of a row that is of the first matrix and corresponds to the bit is smaller than or equal to the first threshold, sort the remaining bits according to reliability of the remaining bits, and select, in descending order of the reliability, the K bits among the sorted remaining bits as information bits. For example, the selecting unit 63 may select the information bits according to the method shown in FIG. 3 and FIG. 5.

Optionally, as another embodiment, the selecting unit 63 may select the K rows among the N rows of the first matrix to construct the second matrix, where reliability of bits that correspond to the K rows is high and the weight of the rows is greater than the first threshold.

Optionally, as another embodiment, the selecting unit 63 may sort the N rows of the first matrix according to the reliability of the corresponding bits, and select, in descending order of the reliability of the corresponding bits, the K rows among the sorted N rows to construct the second matrix, where the weight of the rows is greater than the first threshold.

Optionally, as another embodiment, the selecting unit 63 may remove a row to obtain remaining rows, where the weight of the row is smaller than or equal to the first threshold, sort the remaining rows according to reliability of bits that correspond to the remaining rows, and select, in descending order of the reliability of the corresponding bits, the K rows among the sorted remaining rows to construct the second matrix.

Optionally, as another embodiment, the determining unit 62 may further determine the first threshold according to a minimum code distance requirement of a Polar code. However, the embodiments of the present application are not limited to this. When the determining unit 62 determines the first threshold, another factor may further be considered, for example, a code rate. The code rate may be determined by values of the foregoing N and K, for example, is equal to K/N.

Figure 13:
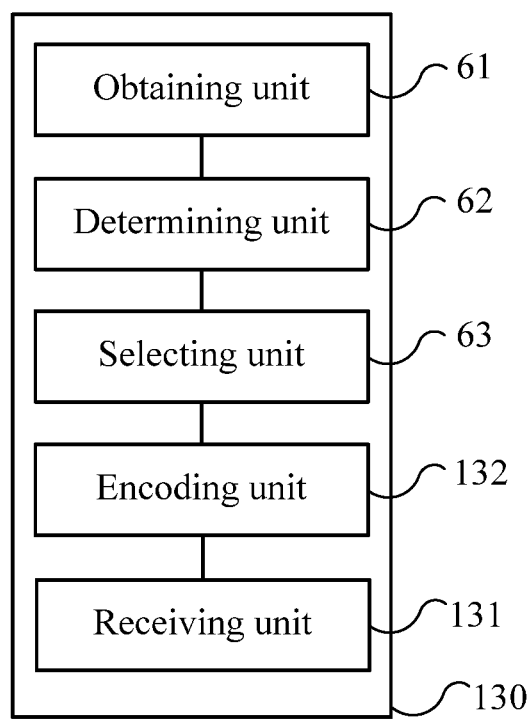
FIG. 13 is a block diagram of an encoding apparatus according to another embodiment of the present application.

FIG. 13 is a schematic block diagram of an encoding apparatus according to another embodiment of the present application. In an encoding apparatus 130 shown in FIG. 13, a part similar to that in FIG. 12 is marked by using the same reference numeral, and repeated description is omitted.

As shown in FIG. 13, in addition to an obtaining unit 61, a determining unit 62, and a selecting unit 63, the encoding apparatus 130 may further include a receiving unit 131 and an encoding unit 132.

The receiving unit 131 receives a to-be-encoded information bit sequence, where the length of the information bit sequence is K and K is a positive integer.

The obtaining unit 61 generates a first matrix of N×N and a sequence that includes N bits, where N is a code length of a Polar code, N rows of the first matrix correspond to the N bits in the sequence in a one-to-one manner, and N is a positive integer.

The determining unit 62 determines reliability of N bits, and determines the weight of each row in the N rows of the first matrix.

The selecting unit 63 selects, according to the reliability of the N bits and the weight of each row in the N rows of the first matrix, K bits among the N bits as information bits, or selects, according to the reliability of the N bits and the weight of each row in the N rows of the first matrix, K rows among the N rows of the first matrix to construct a second matrix of K×N used for encoding, where K is the length of the to-be-encoded information bit sequence and is a positive integer not greater than N.

The encoding unit 132 encodes the information bit sequence according to positions of the information bits or according to the second matrix to obtain an encoded bit sequence whose code length is N.

In the embodiment of the present application, when an information bit or an encoding matrix of a hybrid Polar code is selected, not only reliability of a bit is considered, but also the weight of a row that is of a matrix and corresponds to the bit is considered, so that performance of the Polar code can be improved.

In addition, the hybrid Polar code obtained in the embodiment of the present application is also applied to SC or SC-List decoding, which can achieve better decoding performance.

Figure 14:
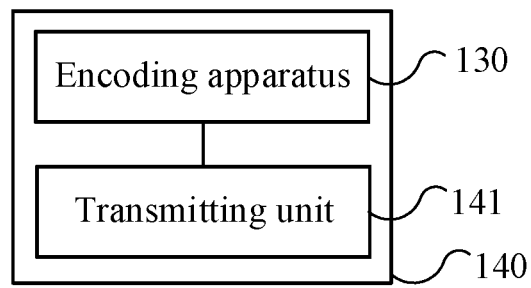
FIG. 14 is a block diagram of a transmitting device according to an embodiment of the present application.

FIG. 14 is a block diagram of a transmitter according to an embodiment of the present application. A transmitter 140 shown in FIG. 14 may include the encoding apparatus 130 shown in FIG. 13, and therefore repeated description is appropriately omitted.

In addition, the transmitter 140 may further include a transmitting unit 141, configured to transmit an encoded bit sequence generated by the encoding apparatus 130.

In the embodiment of the present application, when an information bit or an encoding matrix of a hybrid Polar code is selected, not only reliability of a bit is considered, but also the weight of a row that is of a matrix and corresponds to the bit is considered, so that performance of a code word can be improved.

In addition, the hybrid Polar code obtained in the embodiment of the present application is also applied to SC or SC-List decoding, which can achieve better decoding performance.

Figure 15:
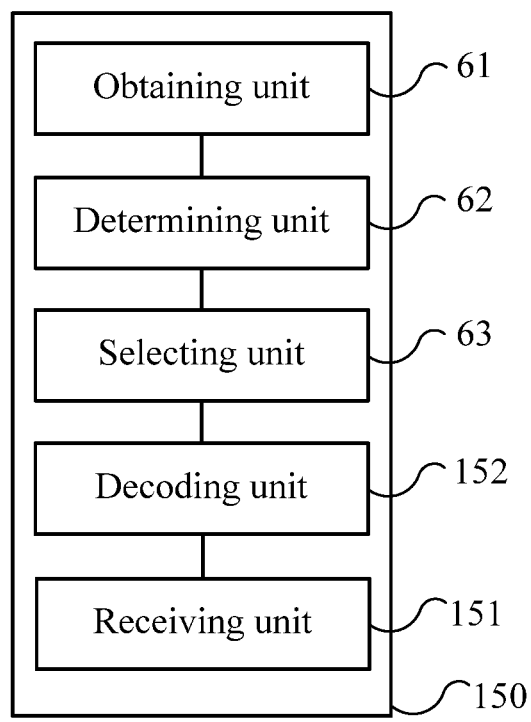
FIG. 15 is a block diagram of a decoding apparatus according to an embodiment of the present application.

FIG. 15 is a block diagram of a decoding apparatus according to an embodiment of the present application. In a decoding apparatus 150 shown in FIG. 15, a part similar to that in FIG. 12 is marked by using the same reference numeral, and repeated description is omitted.

As shown in FIG. 15, in addition to an obtaining unit 61, a determining unit 62, and a selecting unit 63, the decoding apparatus 150 may further include a receiving unit 151 and a decoding unit 152.

The receiving unit 151 receives a demodulated signal whose length is N.

The obtaining unit 61 generates a first matrix of N×N and a sequence that includes N bits, where N is a code length of a Polar code, N rows of the first matrix correspond to the N bits in the sequence in a one-to-one manner, and N is a positive integer.

The determining unit 62 determines reliability of N bits, and determines the weight of each row in the N rows of the first matrix.

The selecting unit 63 selects, according to the reliability of the N bits and the weight of each row in the N rows of the first matrix, K bits among the N bits as information bits, or selects, according to the reliability of the N bits and the weight of each row in the N rows of the first matrix, K rows among the N rows of the first matrix to construct a second matrix of K×N used for encoding, where K is a positive integer not greater than N.

The decoding unit 152 decodes the demodulated signal according to positions of the information bits or according to the second matrix.

In the embodiment of the present application, when an information bit or an encoding matrix of a hybrid Polar code is selected, not only reliability of a bit is considered, but also the weight of a row that is of a matrix and corresponds to the bit is considered, so that performance of the Polar code can be improved.

In addition, the hybrid Polar code obtained in the embodiment of the present application is also applied to SC or SC-List decoding, which can achieve better decoding performance.

Figure 16:
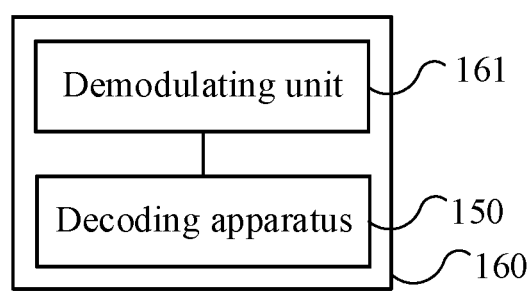
FIG. 16 is a block diagram of a receiving device according to an embodiment of the present application.

FIG. 16 is a block diagram of a receiver according to an embodiment of the present application. A receiver 160 shown in FIG. 16 may include the decoding apparatus 150 shown in FIG. 15, and therefore repeated description is appropriately omitted.

In addition, as shown in FIG. 16, the receiver 160 may further include a demodulating unit 161, configured to demodulate a received signal to generate a demodulated signal whose length is N.

In the embodiment of the present application, when an information bit or an encoding matrix of a hybrid Polar code is selected, not only reliability of a bit is considered, but also the weight of a row that is of a matrix and corresponds to the bit is considered, so that performance of the Polar code can be improved.

In addition, the hybrid Polar code obtained in the embodiment of the present application is also applied to SC or SC-List decoding, which can achieve better decoding performance.

Figure 17:
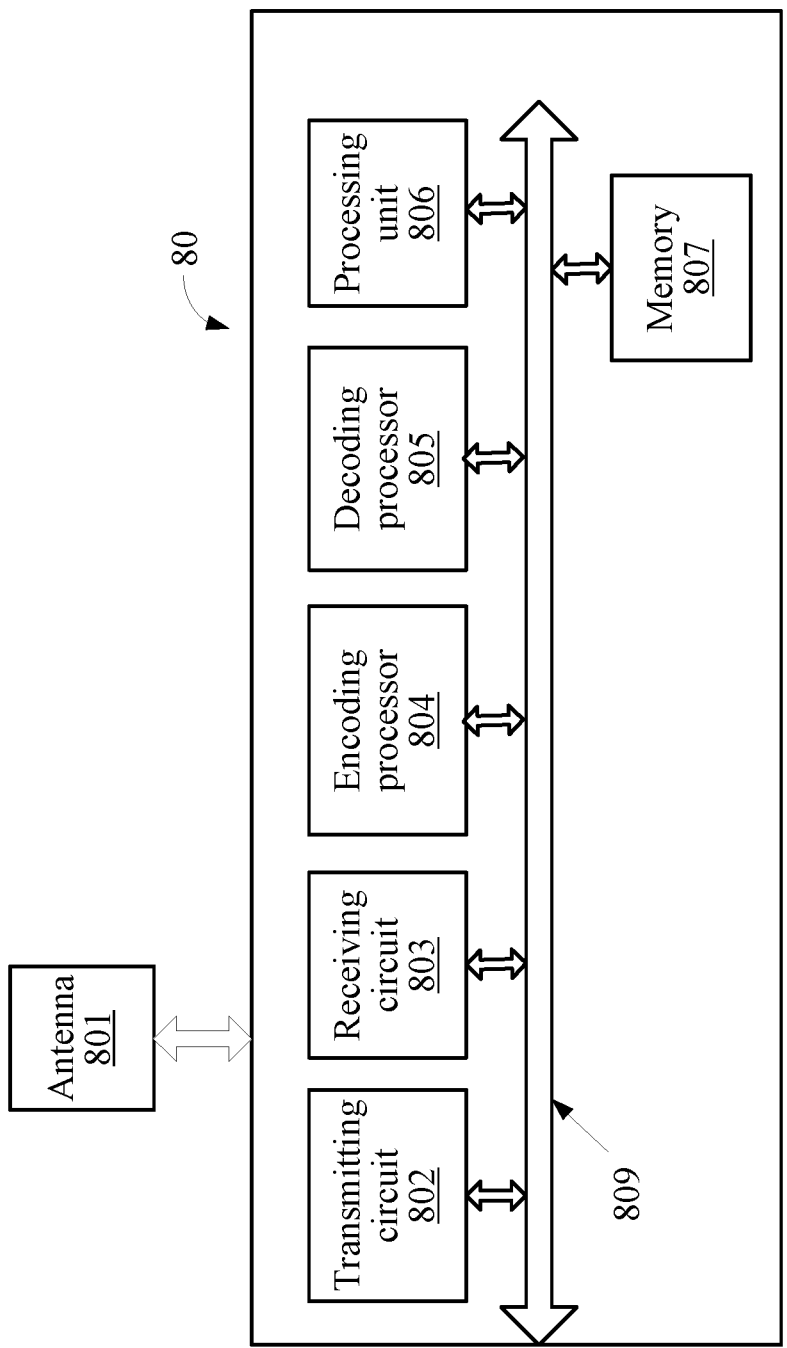
FIG. 17 is a block diagram of an apparatus according to another embodiment of the present application.

FIG. 17 is a schematic block diagram of an apparatus according to another embodiment of the present application. An apparatus 80 shown in FIG. 17 may be configured to implement each step and method in the foregoing method embodiments. An apparatus 80 may be applied to a base station or a terminal in various communications systems. In an embodiment shown in FIG. 17, the apparatus 80 includes a transmitting circuit 802, a receiving circuit 803, an encoding processor 804, a decoding processor 805, a processing unit 806, a memory 807, and an antenna 801. The processing unit 806 controls an operation of the apparatus 80, and the processing unit 806 may also be called a central processing unit (CPU). The memory 807 may include a read-only memory and a random access memory, and provides an instruction and data for the processing unit 806. A part of the memory 807 may further include a nonvolatile random access memory (NVRAM). In an actual application, the apparatus 80 may be embedded into or may be a wireless communications device such as a mobile phone, and may further include a carrier containing the transmitting circuit 802 and the receiving circuit 803, to allow data transmission and reception between the apparatus 80 and a remote position. The transmitting circuit 802 and the receiving circuit 803 may be coupled to the antenna 801. Components of the apparatus 80 are coupled together through a bus system 809, where the bus system 809 further includes a power bus, a control bus, and a status signal bus, in addition to a data bus. However, for clear description, all buses are marked as the bus system 809 in the figure. The apparatus 80 may further include the processing unit 806 configured to process a signal, and additionally further includes the encoding processor 804 and the decoding processor 805.

The method disclosed in the embodiments of the present application may be applied in the encoding processor 804 or the decoding processor 805, or is implemented by the encoding processor 804 or the decoding processor 805. The encoding processor 804 or the decoding processor 805 is possibly an integrated circuit chip, and has a capability of processing a signal. In a process of implementation, each step of the method may be completed by using an integrated logic circuit of hardware in the encoding processor 804 or the decoding processor 805 or instructions in a software form. These instructions may be implemented and controlled by using the processor 806. Configured to execute the method disclosed in the embodiments of the present application, the foregoing decoding processor may be a general processor, a digital signal processor (DSP), an application-specific integrated circuit (ASIC), a field-programmable gate array (FPGA), or another programmable logic device, a discrete gate or transistor logic device, or a discrete hardware component; and can implement or execute each disclosed method, step, and logic block diagram in the embodiments of the present application. The general processor may be a microprocessor or the processor may be any common processor or decoder, and so on. The step with reference to the method disclosed in the embodiments of the present application may be directly executed and completed by a hardware decoding processor or executed and completed by a combination of hardware and a software module in a decoding processor. The software module may be located in a mature storage medium in the art, such as a random access memory, a flash memory, a read-only memory, a programmable read-only memory, an electronically erasable programmable memory, or a register. The storage medium is located in the memory 807, and the encoding processor 804 or the decoding processor 805 reads information in the memory 807, and completes the steps of the method with reference to the hardware. For example, the memory 807 may store information about an obtained Polar code or frozen bits for the encoding processor 804 or the decoding processor 805 to use during encoding or decoding.

For example, the encoding unit 132 shown in FIG. 13 may be implemented by the encoding processor 804, and the decoding unit 152 shown in FIG. 15 may be implemented by the decoding processor 805. In addition, the obtaining unit 61, the determining unit 62, and the selecting unit 63 shown in FIGS. 12 to 13 and FIG. 15 may be implemented by the processor 806, or may be implemented by the encoding processor 804 or the decoding processor 805.

In addition, for example, the transmitter 140 shown in FIG. 14 may be implemented by the encoding processor 804, the transmitting circuit 802, and the antenna 801, and so on. The receiver 150 shown in FIG. 15 may be implemented by the antenna 801, the receiving circuit 803, and the decoding processor 805, and so on. However, the foregoing examples are only exemplary, but are not intended to limit the embodiments of the present application to such specific implementation manners.

Specifically, the memory 807 stores instructions to enable the processor 806, the encoding processor 804, or the decoding processor 805 to implement the following operations: generating a first matrix of N×N and a sequence that includes N bits, where N is a code length of a Polar code, N rows of the first matrix correspond to the N bits in the sequence in a one-to-one manner, and N is a positive integer; determining reliability of the N bits, and determine the weight of each row in the N rows of the first matrix; selecting, according to the reliability of the N bits and the weight of each row in the N rows of the first matrix, K bits among the N bits as information bits, or selecting, according to the reliability of the N bits and the weight of each row in the N rows of the first matrix, K rows among the N rows of the first matrix to construct a second matrix of K×N used for encoding, where K is a positive integer not greater than N.

In the embodiment of the present application, when an information bit or an encoding matrix of a hybrid Polar code is selected, not only reliability of a bit is considered, but also the weight of a row that is of a matrix and corresponds to the bit is considered, so that performance of the Polar code can be improved.

In addition, the Polar code obtained in the embodiment of the present application is also applied to SC or SC-List decoding, which can achieve better decoding performance.

A communications system or a communications apparatus according to an embodiment of the present application may include the apparatus 60, the encoding apparatus 130, the transmitter 140, the decoding apparatus 150, the receiver 160, or the apparatus 80.

A person of ordinary skill in the art may be aware that, in combination with the examples described in the embodiments disclosed in this specification, units and algorithm steps may be implemented by electronic hardware, or a combination of computer software and electronic hardware. Whether the functions are performed by hardware or software depends on particular applications and design constraint conditions of the technical solutions. A person skilled in the art may use different methods to implement the described functions for each particular application, but it should not be considered that such implementation goes beyond the scope of the present application.

It may be clearly understood by a person skilled in the art that, for the purpose of convenient and brief description, for a detailed working process of the foregoing system, apparatus, and unit, reference may be made to the corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communications connections may be implemented through some interfaces. The indirect couplings or communications connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present application essentially, or the part contributing to the prior art, or a part of the technical solutions may be implemented in the form of a software product. The computer software product is stored in a storage medium, and includes several instructions for instructing a computer device (which may be a personal computer, a server, or a network device) to perform all or a part of the steps of the methods described in the embodiments of the present application. The foregoing storage medium includes: any medium that can store program codes, such as a USB flash drive, a removable hard disk, a read-only memory (ROM), a random access memory (RAM), a magnetic disk, or an optical disc.

The foregoing descriptions are merely specific embodiments of the present application, but are not intended to limit the protection scope of the present application. Any variation or replacement that can be readily figured out by a person skilled in the art within the technical scope disclosed in the present application shall all fall within the protection scope of the present application.

What is claimed is:

1. A method for generating a code word, comprising:
   obtaining, by a communication apparatus, K information bits, wherein K is a positive integer;
   obtaining, by the communication apparatus, a matrix of N rows×N columns, wherein N is a code length of the code word to be generated, N is an integer power of 2, and N is greater than K;
   generating, by the communication apparatus, a sequence comprising N bits;
   generating the code word by multiplying the sequence with the matrix; and
   outputting, by the communication apparatus, the code word;
   wherein each row of the matrix has a weight that equals to total number of non-zero elements in the row, and $i^{th}$ row of the matrix corresponds to $i^{th}$ bit position of the sequence, i=1, 2, . . . , N;
   wherein each bit position of the sequence has a reliability;
   wherein K bit positions of the sequence are occupied by the K information bits;
   wherein the K bit positions of the sequence that are occupied by the K information bits are selected according to reliabilities of the bit positions of the sequence and weights of the rows of the matrix.

2. The method according to claim 1,
   wherein the K bit positions of the sequence that are occupied by the K information bits are selected, in descending order of reliability, from the N bit positions of the sequence; and
   wherein the weights of rows in the matrix that correspond to the K selected bit positions are greater than or equal to a weight threshold.

3. The method according to claim 1, wherein the K positions in the sequence that are occupied by the K information bits are selected by:
   excluding one or more bit positions of the sequence, wherein the weights of rows in the matrix that correspond to the excluded bit positions of the sequence are smaller than a weight threshold; and
   selecting, in descending order of the reliability, K bit positions among the remaining bit positions of the sequence for placing the K information bits.

4. The method according to claim 1, wherein when there are more than one rows of the matrix that have a same weight, and there are more than one corresponding bit positions of the sequence that are available for placing one or more information bits, one or more bit positions of the sequence are selected for carrying the one or more information bits in a descending order of reliability of the bit positions.

5. The method according to claim 1, wherein the reliabilities of the N bit positions of the sequence are determined by:
capacities of the bit positions of the sequence, wherein reliability of a bit position is higher when a capacity of the bit position is higher; or
Bhattacharyya parameter of bit positions of the sequence, wherein reliability of a bit position is higher when a Bhattacharyya parameter of the bit position is smaller; or
error probabilities of the bit positions of the second sequence, wherein reliability of a bit position is higher when an error probability of the bit position is smaller.

6. The method according to claim 1, wherein the matrix $G_N$ is generated according to the following equations:

$$G_N = B_N F^{\otimes n} \text{ or}$$

$$G_N = F^{\otimes n},$$

wherein $B_N$ is a bit reversal matrix of N rows×N columns, $F^{\otimes n}$ is a Kronecker power of matrix F, $N=2^n$, and $$F = \begin{bmatrix} 1 & 0 \\ 1 & 1 \end{bmatrix}.$$

7. The method according to claim 1, wherein remaining (N−K) bit positions of the sequence are occupied by bits of a preset value.

8. A communication apparatus, comprising:
a processor,
wherein the processor is coupled to a memory which stores program instructions for execution by the processor,
wherein by executing the program instructions, the apparatus is configured to:
obtain K information bits, wherein K is a positive integer;
obtain a matrix of N rows×N columns, wherein N is a code length of a code word to be generated, wherein N is an integer power of 2, and N is greater than K;
generate a sequence comprising N bits;
generate the code word by multiplying the sequence with the matrix; and
output the code word;
wherein each row of the matrix has a weight that equals to total number of non-zero elements in the row, and $i^{th}$ row of the matrix corresponds to $i^{th}$ bit position of the sequence, i=1, 2, . . . , N;
wherein each bit position of the sequence has a reliability;
wherein K bit positions of the sequence are occupied by the K information bits;
wherein the K bit positions of the sequence that are occupied by the K information bits are selected according to reliabilities of the bit positions of the sequence and weights of the rows of the matrix.

9. The communication apparatus according to claim 8, wherein the K bit positions of the sequence that are occupied by the K information bits are selected, in descending order of reliability, from the N bit positions of second sequence; and
wherein the weights of rows in the first matrix that correspond to the K selected bit positions are greater than or equal to a weight threshold.

10. The communication apparatus according to claim 8, wherein the K positions in the sequence that are occupied by the K information bits are selected by:
excluding one or more bit positions of second sequence, wherein the weights of rows in the matrix that correspond to the excluded bit positions of the second sequence are smaller than a weight threshold; and
selecting, in descending order of the reliability, K bit positions among the remaining bit positions of the sequence for placing the K information bits.

11. The communication apparatus according to claim 8, when there are more than one rows of the matrix that have a same weight, and there are more than one corresponding bit positions of the sequence that are available for placing one or more information bits, one or more bit positions of the sequence are selected for carrying the one or more information bits in a descending order of reliability of the bit positions.

12. The communication apparatus according to claim 8, wherein the reliabilities of the N bit positions of the sequence are determined by:
capacities of the bit positions of the sequence, wherein reliability of a bit position is higher when a capacity of the bit position is higher; or
Bhattacharyya parameter of bit positions of the sequence, wherein reliability of a bit position is higher when a Bhattacharyya parameter of the bit position is smaller; or
error probabilities of the bit positions of the second sequence, wherein reliability of a bit position is higher when an error probability of the bit position is smaller.

13. The communication apparatus according to claim 8, wherein the matrix $G_N$ is generated according to the following equations:

$$G_N = B_N F^{\otimes n} \text{ or}$$

$$G_N = F^{\otimes n},$$

wherein $B_N$ is a bit reversal matrix of N rows×N columns, $F^{\otimes n}$ is a Kronecker power of matrix F, $N=2^n$, and $$F = \begin{bmatrix} 1 & 0 \\ 1 & 1 \end{bmatrix}.$$

14. The communication apparatus according to claim 8, wherein remaining (N−K) bit positions in the second sequence are occupied by bits of a preset value.

15. A non-transitory computer readable medium storing program instructions for execution by a processor in a communication device, wherein the program instructions comprise:
instructions for obtaining K information bits, wherein K is a positive integer;
instructions for obtaining a matrix of N rows×N columns, wherein N is a code length of a code word to be generated, N is an integer power of 2, and N is greater than K;
instructions for generating a s sequence comprising N bits;
instructions for generating the code word by multiplying the sequence with the matrix; and
instructions for outputting the code word;
wherein each row of the matrix has a weight that equals to total number of non-zero elements in the row, and $i^{th}$ row of the matrix corresponds to $i^{th}$ bit position of the sequence, i=1, 2, . . . , N;
wherein each bit position of the sequence has a reliability;
wherein K bit positions of the sequence are occupied by the K information bits;
wherein the K bit positions of the sequence that are occupied by the K information bits are selected according to reliabilities of the bit positions of the sequence and weights of the rows of the matrix.

16. The non-transitory computer readable medium according to claim 15,
wherein the K bit positions of the sequence that are occupied by the K information bits are selected, in descending order of reliability, from the N bit positions of the sequence; and
wherein the weights of rows in the matrix that correspond to the K selected bit positions are greater than or equal to a weight threshold.

17. The non-transitory computer readable medium according to claim 15, wherein when there are more than one rows of the matrix that have a same weight, and there are more than one corresponding bit positions of the sequence that are available for placing one or more information bits, one or more bit positions of the sequence are selected for carrying the one or more information bits in a descending order of reliability of the bit positions.

18. The non-transitory computer readable medium according to claim 15, wherein the reliabilities of the N bit positions of the sequence are determined by:
capacities of the bit positions of the sequence, wherein reliability of a bit position is higher when a capacity of the bit position is higher; or
Bhattacharyya parameter of bit positions of the sequence, wherein reliability of a bit position is higher when a Bhattacharyya parameter of the bit position is smaller; or
error probabilities of the bit positions of the second sequence, wherein reliability of a bit position is higher when an error probability of the bit position is smaller.

19. The non-transitory computer readable medium according to claim 15, wherein the matrix $G_N$ is generated according to the following equations:

$$G_N = B_N F^{\otimes n} \text{ or}$$

$$G_N = F^{\otimes n},$$

wherein $B_N$ is a bit reversal matrix of N rows×N columns, $F^{\otimes n}$ is a Kronecker power of matrix F, $N=2^n$, and $$F = \begin{bmatrix} 1 & 0 \\ 1 & 1 \end{bmatrix}.$$

20. The non-transitory computer readable medium according to claim 15, wherein remaining (N−K) bit positions of the second sequence are occupied by bits of a preset value.

* * * * *